(12) United States Patent
Lim et al.

(10) Patent No.: US 11,342,927 B1
(45) Date of Patent: May 24, 2022

(54) RING OSCILLATOR BASED FREQUENCY DIVIDER

(71) Applicant: QUALCOMM Incorporated, San Diego, CA (US)

(72) Inventors: Younghyun Lim, Gyeongju-si (KR); Yiwu Tang, San Diego, CA (US); Dongmin Park, San Diego, CA (US); Yunliang Zhu, San Diego, CA (US); Mustafa Keskin, San Diego, CA (US); Yue Chao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/361,217

(22) Filed: Jun. 28, 2021

(51) Int. Cl.
*H03L 7/099* (2006.01)
*H03K 21/08* (2006.01)
*H03K 23/66* (2006.01)
*H03L 7/191* (2006.01)

(52) U.S. Cl.
CPC ........... *H03L 7/0995* (2013.01); *H03K 21/08* (2013.01); *H03K 23/667* (2013.01); *H03L 7/191* (2013.01)

(58) Field of Classification Search
CPC .... H03K 21/08; H03K 23/667; H03K 3/0315; H03K 5/00006; H03K 19/018521; H03K 3/356113; H03K 3/354; H03K 3/35625; H03K 5/133; H03K 17/6872; H03K 19/0016; H03K 19/0948; H03K 5/2472; H03L 7/0995; H03L 7/191; H03L 7/183; H02M 3/07; H02M 3/073
See application file for complete search history.

(56) References Cited

U.S. PATENT DOCUMENTS

| | | | |
|---|---|---|---|
| 7,279,995 B2 | 10/2007 | Kernahan et al. | |
| 10,527,667 B2 | 1/2020 | Huang et al. | |
| 10,554,173 B2 | 2/2020 | Matsuda | |
| 10,840,914 B1* | 11/2020 | Tavakol | H03K 23/667 |
| 2010/0201451 A1* | 8/2010 | Wu | H03L 7/0995 331/2 |
| 2011/0012647 A1* | 1/2011 | Qiao | H03K 21/00 327/117 |
| 2013/0300509 A1* | 11/2013 | Kim | H03K 3/0315 331/34 |
| 2016/0344392 A1* | 11/2016 | Melanson | H03M 1/50 |

FOREIGN PATENT DOCUMENTS

| | | |
|---|---|---|
| CN | 108233920 A | 6/2018 |
| CN | 108964654 A | 12/2018 |

* cited by examiner

*Primary Examiner* — John W Poos
(74) *Attorney, Agent, or Firm* — Loza & Loza, LLP

(57) ABSTRACT

Aspects of the disclosure relate to a ring oscillator (RO) frequency divider configured to frequency divide an input clock by a programmable divider ratio to generate an output clock. In this regard, the RO frequency divider receives the input clock, enables each of a ring of N cascaded inverter stages substantially one at a time in response to the input clock; and outputs a second clock from an output of one of the ring of N cascaded inverter stages. In one aspect, each stage includes a p-channel metal oxide semiconductor field effect transistor (PMOS FET) coupled in series with an n-channel metal oxide semiconductor field effect transistor (NMOS FET). In another, each stage includes two PMOS FETs and an NMOS FET.

28 Claims, 10 Drawing Sheets

| Vreg (V) | 0.5 | 0.55 | 0.6 | 0.65 | 0.7 |
|---|---|---|---|---|---|
| DIV4 FMIN (GHz) | 17.5 | 20 | 22.5 | 25 | 27.5 |
| DIV4 FMAX (GHz) | 25 | 32.5 | 37.5 | 42.5 | 47.5 |
| DIV5 FMIN (GHz) | 17.5 | 20 | 22.5 | 27.5 | 30 |
| DIV5 FMAX (GHz) | 32.5 | 40 | 45 | 50 | 55 |

RING OSCILLATOR BASED FREQUENCY DIVIDER

FIELD

Aspects of the present disclosure relate generally to frequency dividers, and in particular, to a ring oscillator based frequency divider.

DESCRIPTION OF RELATED ART

Frequency dividers are used to frequency divide an input clock to generate an output clock. Some frequency dividers may be part of a feedback path of a phase locked loop (PLL) to frequency divide an output clock generated by a voltage controlled oscillator (VCO) to generate a feedback clock for phase-frequency comparison with a reference clock. The frequency of the output clock of the VCO is controlled based on the comparison such that the feedback clock is substantially phase and frequency locked with the reference clock. In such case, the frequency divider may be referred to as a frequency prescaler. In other cases, a frequency divider is not part of the feedback path of a PLL, and may be used simply to frequency divide a clock.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a ring of N cascaded inverter stages, wherein N is a positive integer; and a control circuit including a set of N independent outputs coupled to the ring of N cascaded inverter stages, respectively.

Another aspect of the disclosure relates to an apparatus. The apparatus includes a ring of N cascaded inverter stages, wherein N is a positive integer, wherein each stage of the ring of N cascaded inverter stages comprises a first p-channel metal oxide semiconductor field effect transistor (PMOS FET), a second PMOS FET, and an n-channel metal oxide semiconductor field effect transistor (NMOS FET) coupled in series between first and second voltage rails, wherein the second PMOS FET of the $i^{th}$ cascaded inverter stage includes a gate coupled to a drain of the second PMOS FET of the $i^{th}-1$ (mod N) cascaded inverter stage for integer "i" from zero (0) to N-1, wherein the first PMOS FET of the $i^{th}$ cascaded inverter stage includes a gate coupled to the drain of the second PMOS FET of the $i^{th}-2$ (mod N) cascaded inverter stage for i from zero (0) to N-1, wherein each of the NMOS FET includes a gate to receive a first clock, and wherein the drain of one of the second PMOS FETs of the N cascaded inverter stages to output a second clock.

Another aspect of the disclosure relates to a method. The method includes receiving a first clock; enabling each stage of a ring of N cascaded inverter stages substantially one at a time in response to the first clock in a first mode, wherein N is a positive integer; and outputting a second clock from an output of one of the ring of N cascaded inverter stages.

Another aspect of the disclosure relates to a wireless communication device. The wireless communication device includes a phase locked loop (PLL) including a frequency prescaler, wherein the frequency prescaler includes a ring of N cascaded inverter stages, wherein N is a positive integer, and a circuit to enable each stage of the ring of N cascaded inverters substantially one at a time based on a first clock, wherein an output of one of the N cascaded inverter stages to produce a second clock; a local oscillator (LO) configured to generate an LO signal based on the second clock; and an up-converter or down-converter configured to up-convert or down-convert frequency of a first signal to generate a second signal based on the LO signal, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
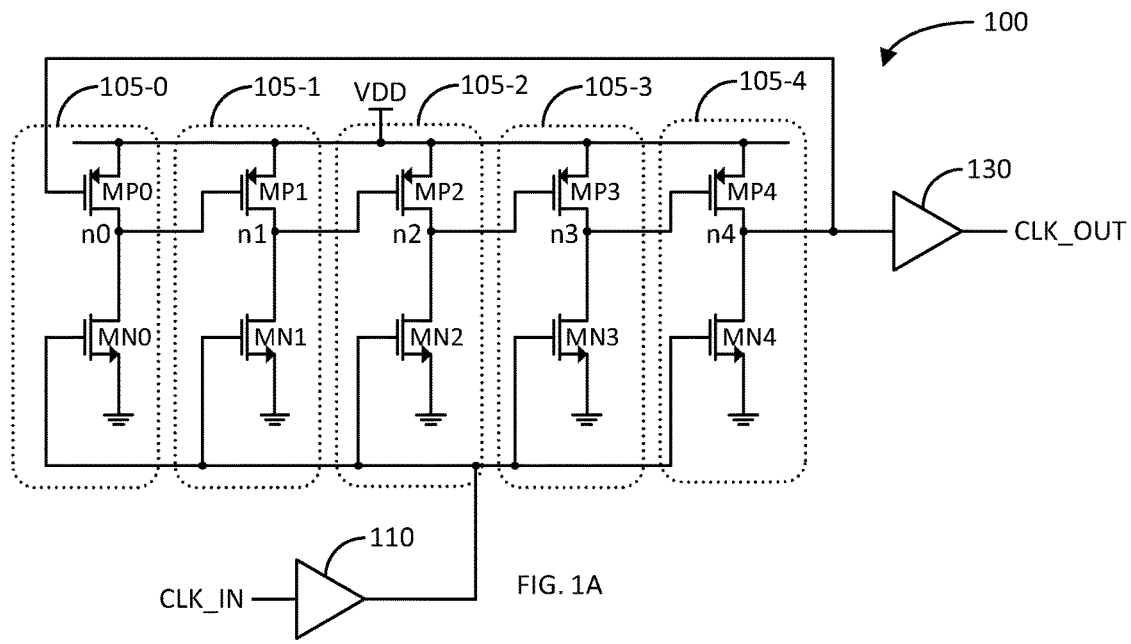
FIG. 1A illustrates a schematic diagram of an example ring oscillator (RO) frequency divider in accordance with an aspect of the disclosure.

FIG. 1A illustrates a schematic diagram of an example ring oscillator (RO) frequency divider 100 in accordance with an aspect of the disclosure. The RO frequency divider 100 is configured to frequency divide an input clock (CLK_IN) to generate an output clock (CLK_OUT) with a divider ratio N defined as a frequency of the input clock CLK_IN to a frequency of the output clock CLK_OUT.

In this example, the RO frequency divider 100 includes a ring of N cascaded inverter stages 105-0 to 105-4 (e.g., N=5, but could be other positive integers), wherein each cascaded inverter stage includes a p-channel metal oxide semiconductor field effect transistor (PMOS FET) coupled in series with an n-channel metal oxide semiconductor field effect transistor (NMOS FET) between an upper voltage rail VDD and a lower voltage rail (e.g., ground). N may represent a positive integer of two (2) or more, or three (3) or more, in this example and in the embodiments described below. For example, embodiments in which N equals 3, 5, or 7 are described below, but N could be other positive integers of two or more, or three or more, in the described embodiments. Cascaded inverter stage 105-0 includes PMOS FET MP0 and NMOS FET MN0; cascaded inverter stage 105-1 includes PMOS FET MP1 and NMOS FET MN1; cascaded inverter stage 105-2 includes PMOS FET MP2 and NMOS FET MN2; cascaded inverter stage 105-3 includes PMOS FET MP3 and NMOS FET MN3; and cascaded inverter stage 105-4 includes PMOS FET MP4 and NMOS FET MN4. In a round robin or modulo-N (modN) manner, the gate of the PMOS FET of the $i^{th}$ cascaded inverter stage is coupled to the drain of the PMOS FET of the $i^{th}-1$ (modN) cascaded inverter stage for all stages (e.g., for an integer "i" from zero (0) to N–1).

The RO frequency divider 100 includes an input buffer 110 with an input to receive the input clock CLK_IN and an output coupled to the gates of the NMOS FETs MN0 to MN4. The RO frequency divider 100 further includes an output buffer 130 including an input coupled to the drain of PMOS FET MP4 or output n4 of the cascaded inverter stage 105-4, and an output to produce the output clock CLK_OUT. As indicated, the set of N cascaded inverter stages 105-0 to 105-4 include respective inputs at the gates of PMOS FETs MP0 to MP4, respectively. The set of N cascaded inverter stages 105-0 to 105-4 include respective outputs at the drains of PMOS FETs MP0 to MP4 or nodes n0 to n4, respectively.

Figure 1B:
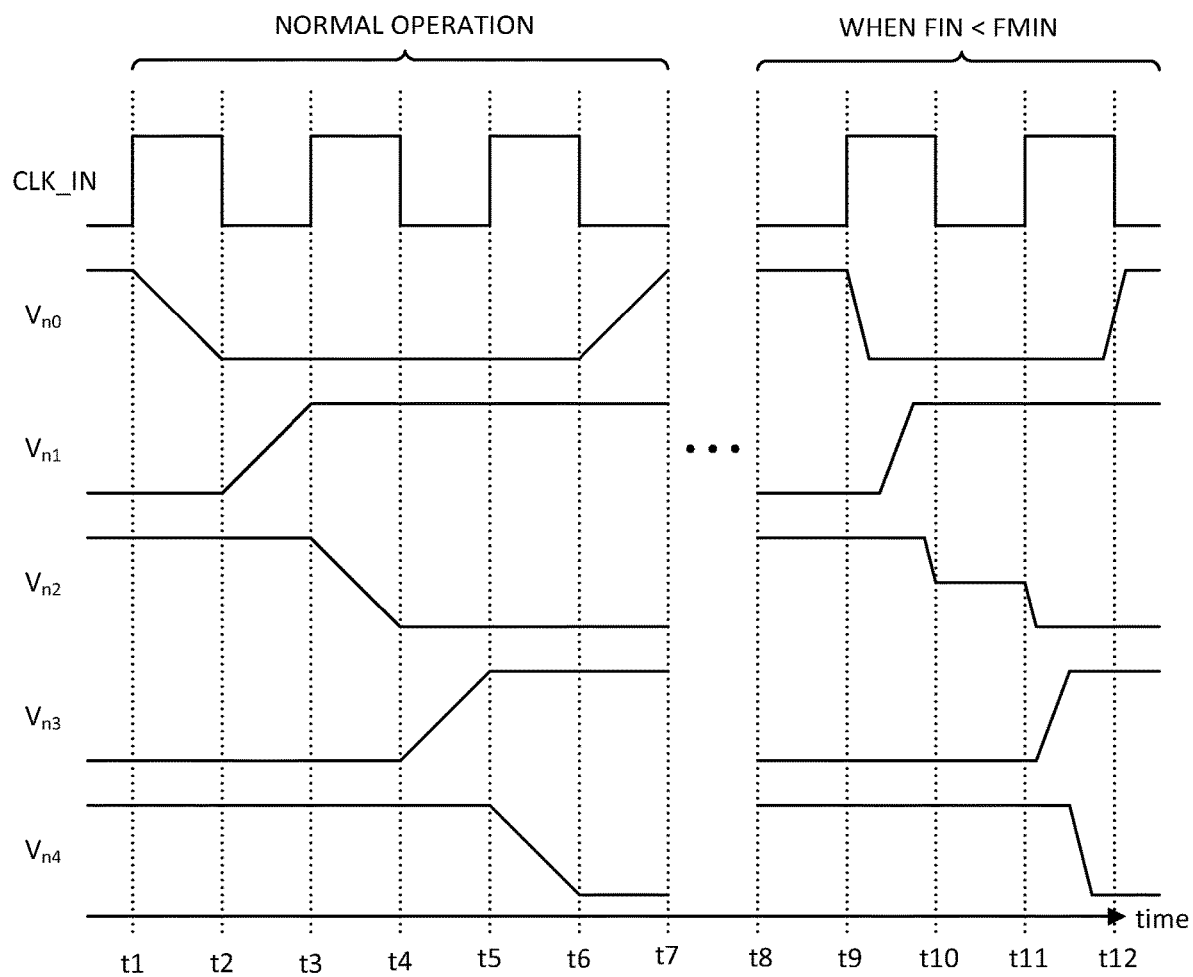
FIG. 1B illustrates a timing diagram of an example operation of the ring oscillator (RO) frequency divider of FIG. 1A in accordance with another aspect of the disclosure.

FIG. 1B illustrates a timing diagram of an example operation of the RO frequency divider 100 in accordance with another aspect of the disclosure. The x- or horizontal-axis of the timing diagram represents time. The y- or vertical axis of the timing diagram presents, from top to bottom, the input clock CLK_IN, and the voltages $V_{n0}$ to $V_{n4}$ at outputs n0 to n4 of the cascaded inverter stages 105-0 to 105-4, respectively. The left-side of the timing diagram (between times t1 and t7) represents an example normal operation of the RO frequency divider 100. The right-side of the timing diagram (between times t8 and t12) represents an example abnormal operation of the RO frequency divider 100.

The RO frequency divider 100 operates by turning on all of the NMOS FETs MN0-MN4 (enabling all of inverter stages 105-0 to 105-4) at substantially the same time in response to each rising or high state of the input clock CLK_IN. For example, with reference to the left-side of the timing diagram, the rising edge of the input clock CLK_IN at time t1 turns on NMOS FET MN0 to force the high voltage $V_{n0}$ (e.g., at VDD) to go low (e.g., ground) as the PMOS FET MP0 is off. The voltage $V_{n0}$ going low turns on PMOS FET MP1 to force the voltage $V_{n1}$ to go high at time t2. The next rising edge of the input clock CLK_IN at time t3 turns on NMOS FET MN2 to force the high voltage $V_{n2}$ to go low as the PMOS FET MP2 is off, and the voltage $V_{n2}$ going low turns on PMOS FET MP3 to force the voltage $V_{n3}$ to go high at time t4. The rising edge of the input clock CLK_IN at time t5 turns on NMOS FET MN4 to force the high voltage $V_{n4}$ to go low as the PMOS FET MP4 is off, and the voltage $V_{n4}$ going low turns on PMOS FET MP0 to force the voltage $V_{n0}$ to go high at time t6. Note that a half period of the voltage $V_{n0}$ extends 2.5 periods of the input clock CLK_IN; thus, the RO frequency divider 100 divides the frequency of the input clock CLK_IN by five (5) or N.

Note that in this implementation, the voltage at a node needs to remain high even though the corresponding NMOS FET is turned on by the input clock CLK_IN. For example, as illustrated in the timing diagram, the voltages $V_{n2}$ and $V_{n4}$ remain high between times t1-t2 during the high state of the input clock CLK_IN when the corresponding NMOS FETs MN2 and MN4 are turned on. This is because the corresponding PMOS FETs MP2 and MP4 are turned on during this time interval t1-t2. In order to maintain the output voltage high when the corresponding NMOS FET is turned on, the PMOS FETs may be made stronger or larger than the NMOS FETs. As a result, the RO frequency divider 100 may have some disadvantages in certain embodiments.

First, the larger-sized PMOS FETs may introduce additional parasitic capacitance and the smaller NMOS FETs may have weak pull-downs, both of which may add significant delays to the frequency division operation of the RO frequency divider 100. Thus, the RO frequency divider 100 may have a maximum operating frequency limited by the size disparity between the PMOS FETs and the NMOS FETs. Second, because the PMOS FETs and NMOS FETs are turned on at substantially the same time, there may be significant current flow through the cascaded inverter stages. Thus, the RO frequency divider 100 may consume significant power. Third, at low input frequency, each cascaded inverter stage of the RO frequency divider 100 may produce multiple pull-downs to lower the corresponding output voltage from the high state (e.g., VDD) to the low state (e.g., ground). Thus, the minimum operating frequency of the RO frequency divider 100 may be impacted as well. The right-side of the timing diagram explains this issue.

For example, the rising edge of the input clock CLK_IN at time t9 turns on NMOS FET MN0 to force the high voltage $V_{n0}$ (e.g., at VDD) to go low (e.g., ground); the voltage $V_{n0}$ going low turns on PMOS FET MP1 to force the voltage $V_{n1}$ to go high; and the voltage $V_{n1}$ going high causes the voltage $V_{n2}$ to go partially low (e.g., VDD/2), all within the high state of the input clock CLK_IN between times t9-t10. This is because the frequency FIN of the input clock CLK_IN is sufficiently low that the corresponding period is large enough that the voltages $V_{n0}$ to $V_{n2}$ change during the high state of the input clock CLK_IN. The next rising edge of the input clock CLK_IN at time t11 then turns on the NMOS FET MN2 to force the voltage $V_{n2}$ to fully go low (e.g., to ground); the voltage $V_{n2}$ going low turns on PMOS FET MP3 to force the voltage $V_{n3}$ to go high after time t11; and the voltage $V_{n3}$ going high turns off PMOS FET MP4 allowing the NMOS FET MN4 to force the voltage $V_{n4}$ to low. As illustrated, the RO frequency divider 100 did not accurately frequency divide the input clock CLK_IN by five (5) as a half period of the voltage $V_{n0}$ is about 1.5 to 2 clock periods of the input clock CLK_IN. Thus, the RO frequency divider 100 may have a minimum operating frequency.

Figure 2A:
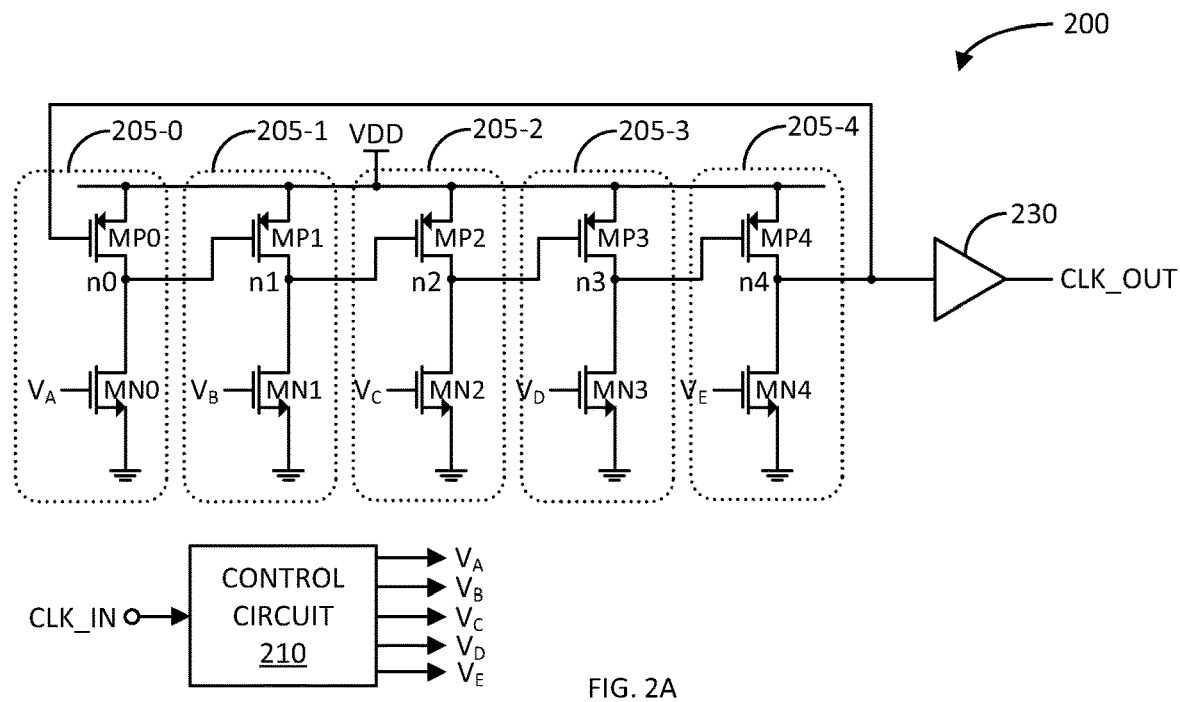
FIG. 2A illustrates a schematic diagram of another example ring oscillator (RO) frequency divider in accordance with another aspect of the disclosure.

FIG. 2A illustrates a schematic diagram of an example ring oscillator (RO) frequency divider 200 in accordance with another aspect of the disclosure. In summary, instead of the input clock CLK_IN turning on the NMOS FETs of the cascaded inverter stages at substantially the same time as in RO frequency divider 100, the RO frequency divider 200 includes a control circuit driven by the input clock CLK_IN to turn on the NMOS FETs substantially one at a time (or in a substantially non-overlapping manner). Thus, the NMOS FETs MN0-MN4 are driven by different control voltages $V_A$ to $V_E$ generated by the control circuit, respectively.

More specifically, the RO frequency divider 200 includes a ring of N cascaded inverter stages 205-0 to 205-(N–1) (e.g., N=5 in the illustrated example), wherein each stage includes a PMOS FET coupled in series with an NMOS FET between an upper voltage rail VDD and a lower voltage rail (e.g., ground). For example, cascaded inverter stage 205-0 includes PMOS FET MP0 and NMOS FET MN0; cascaded inverter stage 205-1 includes PMOS FET MP1 and NMOS FET MN1; cascaded inverter stage 205-2 includes PMOS FET MP2 and NMOS FET MN2; cascaded inverter stage 205-3 includes PMOS FET MP3 and NMOS FET MN3; and cascaded inverter stage 205-4 includes PMOS FET MP4 and NMOS FET MN4. In a round robin or modN manner, the gate of the PMOS FET of the $i^{th}$ cascaded inverter stage is coupled to the drain of the PMOS FET (and the drain of the NMOS FET) of the $i^{th}-1$ (modN) cascaded inverter stage for all stages (e.g., for i from zero (0) to N-1).

The RO frequency divider 200 further includes a control circuit 210 including an input to receive an input clock CLK_IN, and a set of N independent outputs (e.g., N=5) coupled to the gates of the NMOS FETs MN0 to MN4, respectively. The control circuit 210 is configured to generate a set of control voltages $V_A$ to $V_E$ at the set of N independent outputs to turn on the set of NMOS FETs MN0 to MN4 substantially one at a time (e.g., in a substantially non-overlapping manner), respectively. As illustrated, the RO frequency divider 200 further includes an output buffer 230 including an input coupled to an output (e.g., node n4) of one of the cascaded inverter stages (e.g., stage 205-4), and an output at which an output clock CLK_OUT is produced.

Figure 2B:
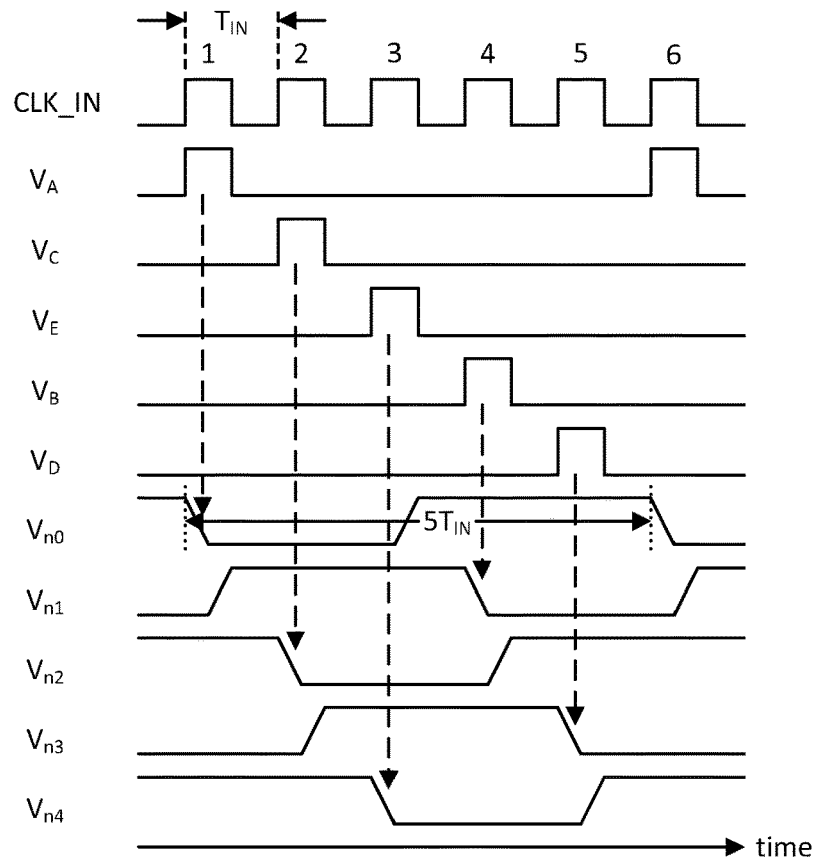
FIG. 2B illustrates a timing diagram of an example sequence of turning on each stage of a ring of N cascaded inverter stages of the ring oscillator (RO) of FIG. 2A substantially one at a time in accordance with another aspect of the disclosure.

FIG. 2B illustrates a timing diagram of an example sequence of turning on the NMOS FETs MN0-MN4 of the set of N cascaded inverter stages 205-0 to 205-4 substantially one at a time in accordance with another aspect of the disclosure. The x- or horizontal-axis of the timing diagram represents time. The y- or vertical axis of the timing diagram represents, from top to bottom, the input clock CLK_IN, the control voltages $V_A$, $V_C$, $V_E$, $V_B$, and $V_D$, and the voltages Vn0 to Vn4 at nodes n0 to n4 (outputs) of the cascaded inverter stages 205-0 to 205-4, respectively.

As illustrated, the control circuit 210, in response to the first positive pulse of the input clock CLK_IN, generates the control voltage $V_A$ with a positive pulse substantially coincidental with the first positive pulse of the input clock CLK_IN. During the first positive pulse of the input clock CLK_IN, the control circuit 210 maintains the other control voltages $V_B$ to $V_E$ at low logic states (e.g., ground). Accordingly, the control voltage $V_A$ turns on the NMOS FET MN0 of the cascaded inverter stage 205-0, while the control voltages $V_B$ to $V_E$ maintain the NMOS FETs MN1 to MN4 of the cascaded inverter stage 205-1 to 205-4 turned off, respectively. Thus, during the first positive pulse of the input clock CLK_IN, the control circuit 210 enables the first cascaded inverter stage 205-0, while disabling the remaining cascaded inverter stages 205-1 to 205-4 (e.g., enabling one cascaded inverter stage at a time). In response to the turned on NMOS FET MN0, the output voltage $V_{n0}$ of the first cascaded inverter stage 205-0 goes low, as indicated by arrowed line. And, in response to the voltage $V_{n0}$ going low, the output voltage $V_{n1}$ of the second cascaded inverter stage 205-1 goes high.

Similarly, in response to the second positive pulse of the input clock CLK_IN, the control circuit 210 generates the control voltage $V_C$ with a positive pulse substantially coincidental with the second positive pulse of the input clock CLK_IN, while maintaining the other control voltages $V_A$, $V_B$, $V_D$, and $V_E$ at low logic states (e.g., ground). Accordingly, the control voltage $V_C$ turns on the NMOS FET MN2 of the cascaded inverter stage 205-2, while the control voltages $V_A$, $V_B$, $V_D$, and $V_E$ maintain the NMOS FETs MN0-1 and MN3-4 turned off, respectively. Thus, during the second positive pulse of the input clock CLK_IN, the control circuit 210 enables the cascaded inverter stage 205-2, while disabling the remaining cascaded inverter stages 205-0, 205-1, 205-3, and 205-4 (e.g., enabling one cascaded inverter stage at a time). In response to the turned on NMOS FET MN2, the output voltage $V_{n2}$ of the cascaded inverter stage 205-2 goes low, as indicated by arrowed line. And, in response to the voltage $V_{n2}$ going low, the output voltage $V_{n3}$ of the cascaded inverter stage 205-3 goes high.

In a similar manner, the other cascaded inverter stages 205-4, 205-1, and 205-3 are the only ones turned on or enabled during the third, fourth, and fifth positive pulses of the input clock CLK_IN, respectively, as indicated by the corresponding arrowed lines. As illustrated, the output voltage $V_{n0}$ of the cascaded inverter stage 205-0 has a period that extends from the first positive pulse to the fifth positive pulse of the input clock CLK_IN. The other output voltages $V_{n1}$ to $V_{n4}$ have substantially the same period as the output voltage $V_{n0}$. Thus, the frequency of the output clock CLK_OUT is ⅕ or (1/N) of the frequency of the input clock CLK_IN (in other words, the divider ratio is five (5) or N).

Because the N cascaded inverter stages are enabled substantially one at a time, the PMOS FET and the NMOS FET of each stage are not turned on at the same time. Thus, the PMOS FET need not be configured stronger or larger than the NMOS FET to implement ratio logic as in RO frequency divider 100, and in some embodiments of the RO frequency divider 200 each of the PMOS FETs MP0-MP(N−1) is approximately the same size as the respective NMOS FET MN0-MN(N−1). This reduces the large parasitic capacitances of the PMOS FETs, as well as the comparatively weak pull-down of the NMOS FETs. This may result in reducing the propagation delay of the cascaded inverter stages 205-0 to 205-(N−1); thereby, allowing the RO frequency divider 200 to operate at higher frequencies and potentially with reduced power consumption. At low frequency, the NMOS FETs are able to fully pull down the corresponding output voltages during each clock cycle because there is no turned-on PMOS FET fighting the pull down. Thus, the RO frequency divider 200 may eliminate the multiple pull downs per clock cycle that may occur in RO frequency divider 100.

It should be understood that the timing diagram illustrated in FIG. 2B is an example only. For instance, while the diagram in FIG. 2B corresponds to a configuration in which a clock high pulse triggers certain operations of the divider (e.g., enablement of one of the stages), in other embodiments the operations (e.g., enablement of one of the stages) may be triggered by the clock being or transitioning to a low value. One such embodiment is described below with respect to FIGS. 3A and 3B. Other such embodiments are described below with respect to subsequent figures.

Figure 3A:
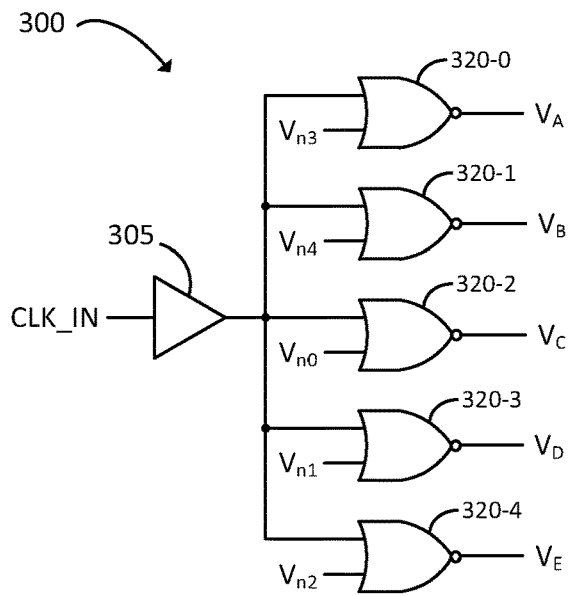
FIG. 3A illustrates a schematic diagram of an example control circuit in accordance with another aspect of the disclosure.

FIG. 3A illustrates a schematic diagram of an example control circuit 300 in accordance with another aspect of the disclosure. The control circuit 300 may be one example implementation of the control circuit 210 previously discussed. The control circuit 300 includes an input buffer 305 and a set of N NOR gates 320-0 to 320-4 (e.g., N=5 in the illustrated example). The input buffer 305 includes an input to receive the input clock CLK_IN. The set of NOR gates 320-0 to 320-4 include respective first inputs coupled to an output of the input buffer 305. The set of NOR gates 320-0 to 320-4 include respective second inputs coupled to output nodes n3, n4, n0, n1, and n2 of cascaded inverter stages 205-3, 205-4, 205-0, 205-1, and 205-2, respectively. The set of NOR gates 320-0 to 320-4 include a set of outputs, where control voltages $V_A$, $V_B$, $V_C$, $V_D$, and $V_E$ are generated, coupled to the gates of the NMOS FETs MN0 to MN4 of the cascaded inverter stages 205-0 to 205-4, respectively.

In general, the second input of the $i^{th}$ NOR gate (e.g., 320-$i$) is coupled to the drain of the PMOS (and NMOS) FET (output) of the $i^{th}$−2 (modN) cascaded inverter stage for "i" from zero (0) to N−1. Considering some examples, for i=0, the NOR gate 320-0 includes a second input coupled to the output node n3 (to receive the output voltage $V_{n3}$) of the cascaded inverter stage 205-3, where i−2 (mod5)=0-2 (mod 5)=−2 (mod5)=3. Similarly, for i=1, the NOR gate 320-1 includes a second input coupled to the output node n4 (to receive the output voltage $V_{n4}$) of the cascaded inverter stage 205-4, where i−2 (mod5)=1-2 (mod5)=−1 (mod5)=4. For i=2, the NOR gate 320-2 includes a second input coupled to the output node n0 (to receive the output voltage $V_{n0}$) of the cascaded inverter stage 205-0, where i−2 (mod5)=2-2 (mod5)=0 (mod5)=0; and so on.

In other embodiments (not illustrated), the second input of the $i^{th}$ NOR gate (e.g., 320-$i$) is coupled to the drain of the PMOS (and NMOS) FET (output) of the $i^{th}$−4 (modN) cascaded inverter stage for "i" from zero (0) to N−1. For example, for i=0, the NOR gate 320-0 may include a second input coupled to the output node n1 (to receive the output voltage $V_{n1}$) of the cascaded inverter stage 205-1, where i−4 (mod5)=0-4 (mod 5)=−4 (mod5)=1. In some embodiments, the second input of the $i^{th}$ NOR gate is coupled to the drain of the PMOS (and NMOS) FET (output) of the $i^{th}$−E (modN) cascaded inverter stage for "i" from zero (0) to N−1, where E represents an even positive integer which is less than N.

Figure 3C:
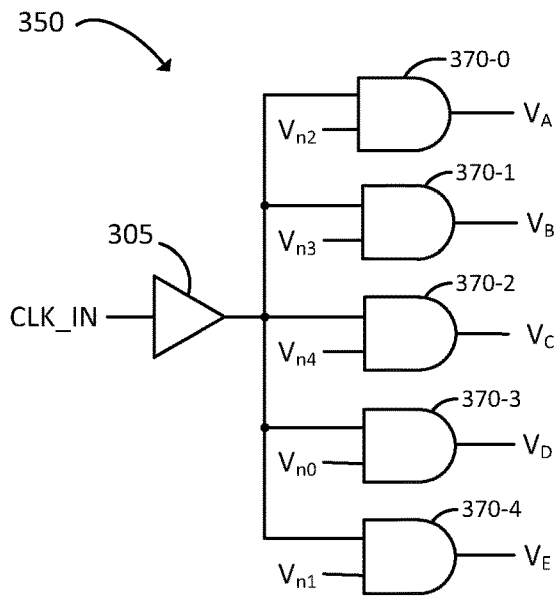
FIG. 3C illustrates a schematic diagram of an example control circuit in accordance with another aspect of the disclosure.
Figure 3B:
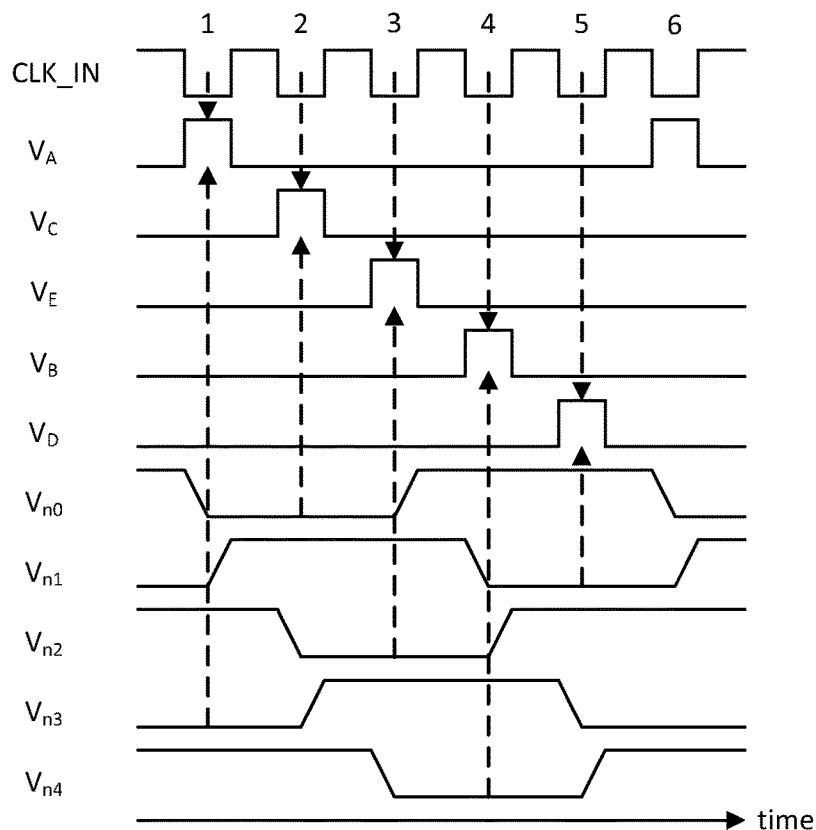
FIG. 3B illustrates a timing diagram of an example operation of the control circuit of FIG. 3A in accordance with another aspect of the disclosure.

FIG. 3B illustrates a timing diagram of an example operation of the control circuit 300 in accordance with another aspect of the disclosure. The x- or horizontal-axis of the timing diagram represents time. The y- or vertical axis of the timing diagram represents, from top to bottom, the input clock CLK_IN, the control voltages $V_A$, $V_C$, $V_E$, $V_B$, and $V_D$, and the voltages $V_{n0}$ to $V_{n4}$ at output nodes n0 to n4 of the cascaded inverter stages 205-0 to 205-4, respectively.

As illustrated, the NOR gate 320-0 of the control circuit 300, in response to a first negative pulse of the input clock CLK_IN and the output voltage $V_{n3}$ being at a low logic state, generates the control voltage $V_A$ with a positive pulse substantially coincidental with the first negative pulse of the input clock CLK_IN, as indicated by the arrowed line. During the first negative pulse of the input clock CLK_IN, the other NOR gates 320-1 to 320-4 of the control circuit 300 maintain the other control voltages $V_B$ to $V_E$ at low logic states. Accordingly, the control voltage $V_A$ turns on the NMOS FET MN0 of the cascaded inverter stage 205-0, while the control voltages $V_B$ to $V_E$ maintain the NMOS FETs MN1 to MN4 turned off. In response to the turned on NMOS FET MN0, the output voltage $V_{n0}$ of the cascaded inverter stage 205-0 goes low. And, in response to the voltage $V_{n0}$ going low, the output voltage $V_{n1}$ of the cascaded inverter stage 205-1 goes high.

Similarly, the NOR gate 320-2 of the control circuit 300, in response to a second negative pulse of the input clock CLK_IN and the output voltage $V_{n0}$ being at a low logic state, generates the control voltage $V_C$ with a positive pulse substantially coincidental with the second negative pulse of the input clock CLK_IN, as indicated by the arrowed line. During the second negative pulse of the input clock CLK_IN, the other NOR gates 320-0, 320-1, 320-3, and 320-4 of the control circuit 300 maintain the other control voltages $V_A$, $V_B$, $V_D$, and $V_E$ at low logic states. Accordingly, the control voltage $V_C$ turns on the NMOS FET MN2 of the cascaded inverter stage 205-2, while the control voltages $V_A$, $V_B$, $V_D$, and $V_E$ maintain the NMOS FETs MN0, MN1, MN3, and MN4 turned off. In response to the turned on NMOS FET MN2, the output voltage $V_{n2}$ of the cascaded inverter stage 205-2 goes low. And, in response to the voltage $V_{n2}$ going low, the output voltage $V_{n3}$ of the cascaded inverter stage 205-3 goes high.

In a similar manner, the other cascaded inverter stages 205-4, 205-1, and 205-3 are the only ones turned on or enabled during the third, fourth, and fifth negative pulses of the input clock CLK_IN, as indicated by the corresponding arrowed lines. As illustrated, the output voltage $V_{n0}$ of the first cascaded inverter stage has a period that extends from the first negative pulse to the fifth negative pulse of the input clock CLK_IN. The other output voltages $V_{n1}$ to $V_{n4}$ have substantially the same period as the output voltage $V_{n0}$.

Thus, the frequency of the output clock CLK_OUT is ⅕ or 1/N of the frequency of the input clock CLK_IN (in other words, the divider ratio is five (5) or N).

Note that the voltages $V_{n0}$ to $V_{n4}$ at the second inputs of the NOR gates 320-0 to 320-4 are at low logic states substantially one clock period before the NOR gates 320-0 to 320-4 generate their respective positive pulses. Thus, the control circuit 300 does not introduce any additional delay to the frequency division operation of the RO frequency divider 200.

FIG. 3C illustrates a schematic diagram of an example control circuit 350 in accordance with another aspect of the disclosure. The control circuit 350 may be one example implementation of the control circuit 210 previously discussed. In contrast to the control circuit 300, the control circuit 350 is configured such that a clock high pulse will trigger certain operations of the divider (e.g., enablement of one of the stages 205 of the divider 200), for example as described with respect to FIG. 2B.

The control circuit 350 includes the input buffer 305 and a set of N AND gates 370-0 to 370-4 (e.g., N=5 in the illustrated example). The input buffer 305 includes an input to receive the input clock CLK_IN. The set of AND gates 370-0 to 370-4 include respective first inputs coupled to an output of the input buffer 305. The set of AND gates 370-0 to 370-4 include respective second inputs coupled to output nodes n2, n3, n4, n0, and n1 of cascaded inverter stages 205-2, 205-3, 205-4, 205-0, and 205-1, respectively. The set of AND gates 370-0 to 370-4 include a set of outputs, where control voltages $V_A$, $V_B$, $V_C$, $V_D$, and $V_E$ are generated, coupled to the gates of the NMOS FETs MN0 to MN4 of the cascaded inverter stages 205-0 to 205-4, respectively.

In general, the second input of the $i^{th}$ AND gate (e.g., 370-$i$) is coupled to the drain of the PMOS (and NMOS) FET (output) of the $i^{th}$−3 (modN) cascaded inverter stage for "i" from zero (0) to N−1. Considering some examples, for i=0, the AND gate 370-0 includes a second input coupled to the output node n2 (to receive the output voltage $V_{n2}$) of the cascaded inverter stage 205-2, where i−3 (mod5)=0−3 (mod 5)=−3 (mod5)=2. Similarly, for i=1, the AND gate 370-1 includes a second input coupled to the output node n3 (to receive the output voltage $V_{n3}$) of the cascaded inverter stage 205-3, where i−2 (mod5)=1−3 (mod5)=−2 (mod5)=3. For i=2, the AND gate 370-2 includes a second input coupled to the output node n4 (to receive the output voltage $V_{n4}$) of the cascaded inverter stage 205-4, where i−3 (mod5)=2−3 (mod 5)=−1 (mod5)=4; and so on.

In other embodiments (not illustrated), the second input of the $i^{th}$ AND gate (e.g., 370-$i$) is coupled to the drain of the PMOS (and NMOS) FET (output) of the $i^{th}$−1 (modN) cascaded inverter stage for "i" from zero (0) to N−1. For example, for i=0, the AND gate 370-0 may include a second input coupled to the output node n4 (to receive the output voltage $V_{n4}$) of the cascaded inverter stage 205-4, where i−1 (mod5)=0−1 (mod 5)=−1 (mod5)=4. In some embodiments, the second input of the $i^{th}$ AND gate is coupled to the drain of the PMOS (and NMOS) FET (output) of the $i^{th}$−R (modN) cascaded inverter stage for "i" from zero (0) to N−1, where R represents an odd positive integer which is less than N−1.

Figure 4A:
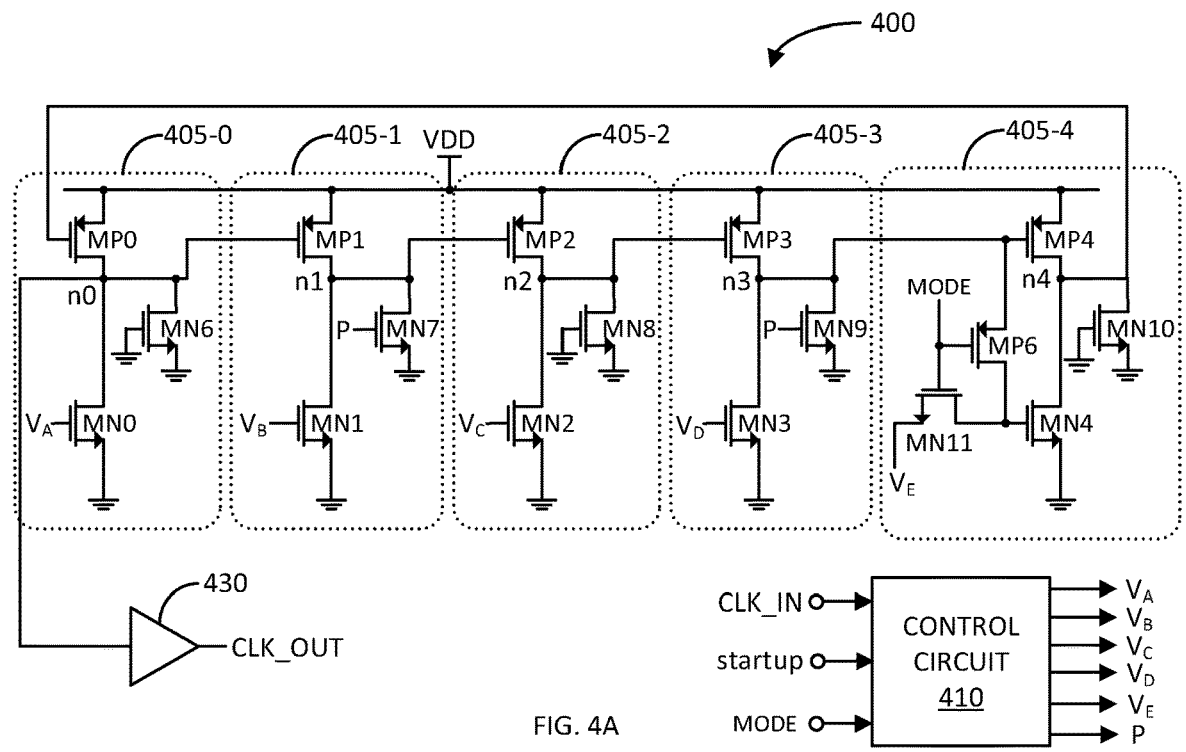
FIG. 4A illustrates a schematic diagram of another example ring oscillator (RO) frequency divider in accordance with another aspect of the disclosure.

FIG. 4A illustrates a schematic diagram of an example RO frequency divider 400 in accordance with another aspect of the disclosure. The RO frequency divider 400 is similar to that of RO frequency divider 200, but includes pre-discharging NMOS FETs to configure the RO frequency divider 400 to an initial state by explicitly pre-discharging outputs nodes of every other N cascaded inverter stages upon start-up. Further, dummy NMOS FETs are coupled to the outputs nodes not having the pre-discharging NMOS FETs of the remaining cascaded inverter stages to balance the load for each cascaded inverter stage. Additionally, the RO frequency divider 400 is configured to frequency divide by five (5) or four (4) (e.g., N or N−1) based on a divider ratio mode signal. Thus, the RO frequency divider 400 may be referred to as a dual-modulus, or more generally, a multi-modulus frequency divider. While not explicitly illustrated in certain subsequent figures, pre-discharging FETs and dummy FETs may be implemented in any of the RO frequency dividers illustrated and/or described in this application.

More specifically, the RO frequency divider 400 includes a ring of N cascaded inverter stages 405-0 to 405-4 (e.g., N=5 in the illustrated embodiment), wherein each stage comprises a PMOS FET coupled in series with an NMOS FET between an upper voltage rail VDD and a lower voltage rail (e.g., ground). As in RO frequency divider 200, the gate of the PMOS FET of the $i^{th}$ cascaded inverter stage is coupled to the drain of the PMOS FET (and the drain of the series NMOS FET) of the $i^{th}$−1 (modN) cascaded inverter stage for all stages (e.g., for i from zero (0) to N−1).

In addition to the PMOS FET coupled in series with the NMOS FET, the cascaded inverter stages 405-1 and 405-3 include NMOS FETs MN7 and MN9 coupled between the drains of the PMOS FETs MP1 and MP3 and the lower voltage rail (e.g., ground), respectively. The NMOS FETs MN7 and MN9 include gates to receive a pre-discharging signal P. So that the loads presented to the output nodes n0 to n4 of the cascaded inverter stages 405-0 to 405-4 are substantially balanced, the cascaded inverter stages 405-0, 405-2, and 405-4 include dummy NMOS FETs MN6, MN8, and MN10 coupled between the drains of the PMOS FETs MP0, MP2, and MP4 and the lower voltage rail (e.g., ground), respectively. The dummy NMOS FETs MN6, MN8, and MN10 include gates coupled to the lower voltage rail (e.g., ground) to turn off these devices. A dummy FET, as defined herein, is one that is always turned off by, for example, setting the gate-to-source voltage to zero (0) or below the threshold voltage of the dummy FET.

To effectuate the dual-modulus functionality, the cascaded inverter stage 405-4 further includes one or more switching devices to selectively couple the gate of the NMOS FET MN4 to the corresponding output (e.g., the $V_E$ output) of the control circuit 410 or the drain of the PMOS FET MP3 (output n3) of the previous cascaded inverter stage 405-3. In general, the $j^{th}$ cascaded inverter stage, that includes such one or more switching devices to effectuate dual- or multi-modulus functionality, includes an NMOS FET with a gate coupled to either the $j^{th}$ output of a control circuit 410 or the drain of the PMOS FET of the $j^{th}$−1 cascaded inverter stage based on the state of the one or more switching devices, wherein "j" is a positive or neutral integer equal to or less than N−1.

More specifically, in cascaded inverter stage 405-4 in the illustrated embodiment, the one or more switching devices include PMOS FET MP6 coupled between the drain of the PMOS FET MP3 of the previous cascaded inverter stage 405-3 and the gate of the NMOS FET MN4. The one or more switching devices further includes an NMOS FET MN11 coupled between the $V_E$ output of the control circuit 410 and the gate of the NMOS FET MN4. The PMOS FET MP6 and NMOS FET MN11 include gates coupled together to receive the divider ratio mode signal. It will be appreciated that other configurations of one or more switching devices configured to perform the functions described herein may be implemented (e.g., as illustrated/described with respect to subsequent figures).

If the divider ratio mode signal is at a high logic state (e.g., VDD), the PMOS FET MP6 is turned off, and the NMOS FET MN11 is turned on. Thus, the gate of the NMOS FET MN4 is coupled to the $V_E$ output of the control circuit 410, and the RO frequency divider 400 operates as a divide-by-five (/N) frequency divider as in RO frequency divider 200. If the divider mode signal is at a low logic state, the PMOS FET MP6 is turned on, and the NMOS FET MN11 is turned off. Thus, the gate of the NMOS FET MN4 is coupled to drain of the PMOS FET MP3 of the previous cascaded inverter stage 405-3, and the RO frequency divider 400 operates as a divide-by-four (/(N−1)) frequency divider, as the last stage 405-4 is enabled by the clock phase or $V_D$ associated with the previous cascaded inverter stage 405-3. For example, the last stage 405-4 may be configured to act as an inverter in this configuration. Thus, the divider ratio, being a frequency of the input clock to a frequency of the output clock, is greater when the gate of the NMOS FET of the $j^{th}$ cascaded inverter stage is coupled to the $j^{th}$ output of the control circuit compared to when the gate of the NMOS FET of the $j^{th}$ cascaded inverter stage is coupled to the drain of the PMOS FET of the $j^{th}$−1 cascaded inverter stage.

The RO frequency divider 400 further includes the control circuit 410, which may be similar to control circuit 210, 300, or 350 previously discussed in detail, but includes further logic to assert/deassert the pre-discharging signal P in response to a startup signal and the input clock CLK_IN. Similar to RO frequency divider 200, the RO frequency divider 400 further includes an output buffer 430 including an input coupled to an output (e.g., node n0) of one of the cascaded inverter stages (e.g., stage 405-0), and an output at which an output clock CLK_OUT is produced.

Figure 4B:
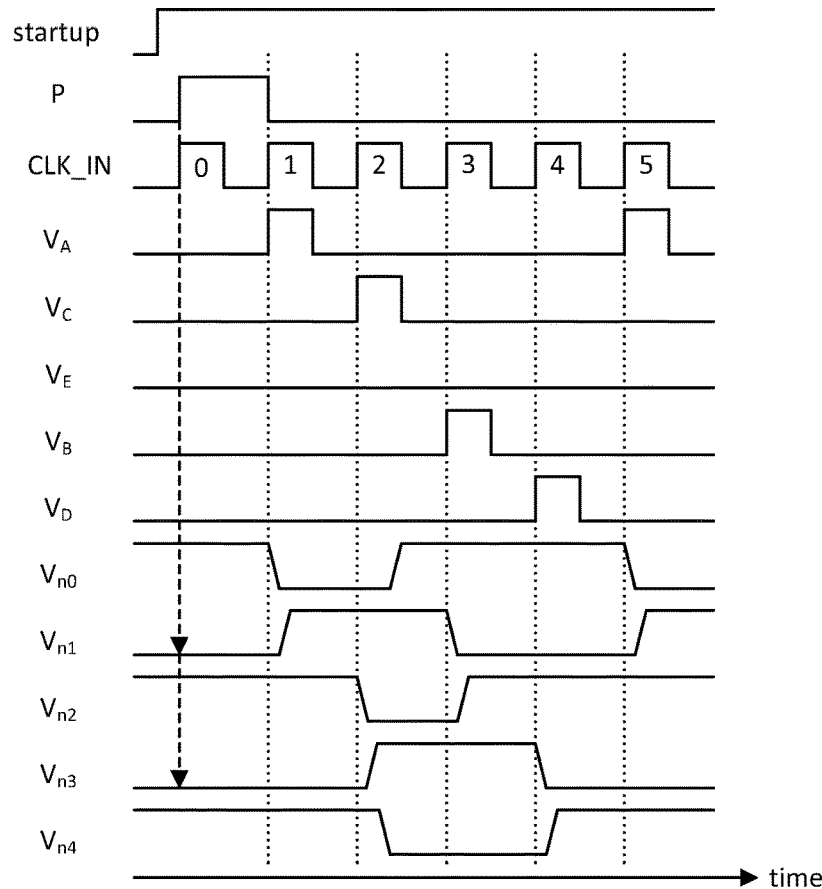
FIG. 4B illustrates a timing diagram of an example operation of the ring oscillator (RO) frequency divider of FIG. 4A in accordance with another aspect of the disclosure.

FIG. 4B illustrates a timing diagram of an example operation of the RO frequency divider 400 in accordance with another aspect of the disclosure. The x- or horizontal-axis of the timing diagram represents time. The y- or vertical axis of the timing diagram represents, from top to bottom, the startup signal, the pre-discharging signal P, the input clock CLK_IN, the control voltages $V_A$, $V_C$, $V_E$, $V_B$, and $V_D$, and the voltages $V_{n0}$ to $V_{n4}$ at output nodes n0 to n4 of the cascaded inverter stages 405-0 to 405-4, respectively. In this example, the divider ratio mode signal is at a low state; thereby, configuring the RO frequency divider 400 to divide-by-four.

For example, prior to pulse "0" of the input clock CLK_IN, when the startup signal is deasserted, the control circuit 410 isolates the input clock CLK_IN from the logic (e.g., NOR gates) of the control circuit 410. In response to the startup signal being asserted and the rising edge or pulse "0" of the input clock CLK_IN, the control circuit 410 asserts (e.g., brings to a high logic state) the pre-discharging signal P to turn on NMOS FETs MN7 and MN9. As illustrated by the arrowed lines in the timing diagram, this explicitly discharges nodes n1 and n3, as indicated by the voltages $V_{n1}$ and $V_{n3}$ being at low logic states.

In response to the rising edge of pulse "1" of the input clock CLK_IN, the control circuit 410 deasserts the pre-discharging signal P to turn off NMOS FETs MN7 and MN9, and allow nodes n1 and n3 to reach the appropriate voltage levels pursuant to the frequency division operation. Also, in response to the rising edge of pulse "1", the control circuit 410 generates the control voltage $V_A$ with a pulse substantially coincidental with pulse "1" of the input clock CLK_IN. In response to the high state of the control voltage $V_A$, the NMOS MN0 turns on, causing the output voltage $V_{n0}$ of the cascaded inverter stage 405-0 to go low; and the output voltage $V_{n0}$ going low turns on PMOS FET MP1 of the cascaded inverter stage 405-1, causing the output voltage $V_{n1}$ to go high.

In response to the rising edge of pulse "2", the control circuit 410 generates the control voltage $V_C$ with a pulse substantially coincidental with pulse "2" of the input clock CLK_IN. In response to the high state of the control voltage $V_C$, the NMOS MN2 turns on, causing the output voltage $V_{n2}$ of the cascaded inverter stage 405-2 to go low; the output voltage $V_{n2}$ going low turns on PMOS FET MP3 of the cascaded inverter stage 405-3; the turning on of PMOS FET MP3 causes the output voltage $V_{n3}$ to go high; the output voltage $V_{n3}$ going high turns on the NMOS FET MN4 of the cascaded inverter stage 405-4 as it is coupled to node n3 in divide-by-four mode; the turning on of the NMOS FET MN4 causes the output voltage $V_{n4}$ of the cascaded inverter stage 405-4 to go low; the output voltage $V_{n4}$ going low turns on PMOS FET MP0; and the turning on of PMOS FET MP0 causes the output voltage $V_{n0}$ to go high.

In response to the rising edge of pulse "3", the control circuit 410 generates the control voltage $V_B$ with a pulse substantially coincidental with pulse "3" of the input clock CLK_IN. In response to the high state of the control voltage $V_B$, the NMOS MN1 turns on causing the output voltage $V_{n1}$ of the cascaded inverter stage 405-1 to go low, and the output voltage $V_{n1}$ going low turns on PMOS FET MP2 of the cascaded inverter stage 405-2; thereby, causing the output voltage $V_{n2}$ to go high.

In response to the rising edge of pulse "4", the control circuit 410 generates the control voltage $V_D$ with a pulse substantially coincidental with pulse "4" of the input clock CLK_IN. In response, the high state of the control voltage $V_D$, the NMOS MN3 turns on causing the output voltage $V_{n3}$ of the cascaded inverter stage 405-3 to go low, and the output voltage $V_{n3}$ going low turns on PMOS FET MP4 of the cascaded inverter stage 405-4, causing the output voltage Vn4 to go high.

In response to the rising edge of pulse "5", the frequency dividing process indicated with respect to pulses 1-4 repeats. As illustrated, the output voltage $V_{n0}$ of the cascaded inverter stage 405-0 has a period substantially equal to four (4) periods of the input clock CLK_IN; thereby, the RO frequency divider 400 performs the divide-by-four operation. Note that in the divide-by-four mode, the control circuit 410 asserts the control voltages $V_A$, $V_C$, $V_B$, and $V_D$ in that sequence per input clock pulse. In some embodiments, the control circuit 410 is configured to skip control voltage $V_E$ (or output a constant low voltage for $V_E$) as it is not used in divide-by-four mode. The control circuit 410 may otherwise be configured as illustrated in FIG. 3A (or as illustrated in FIG. 3C when a clock high trigger is implemented), and may further be configured to pass an input mode signal to the divider 400 or to generate the mode signal for the divider 400 based on a mode control input to the control circuit 410. In some embodiments, for example, a first input of the NOR gate 320-4 is selectively coupled to either the output of the input buffer 305 or a constant input voltage (e.g., VDD, such that NOR gate 320-4 outputs a low voltage) based on the mode signal or mode control input received at the control circuit. In other embodiments, a pulse is generated by NOR gate 320-4, but is effectively blocked by the NMOS FET MN11.

Figures 5A, 5B:
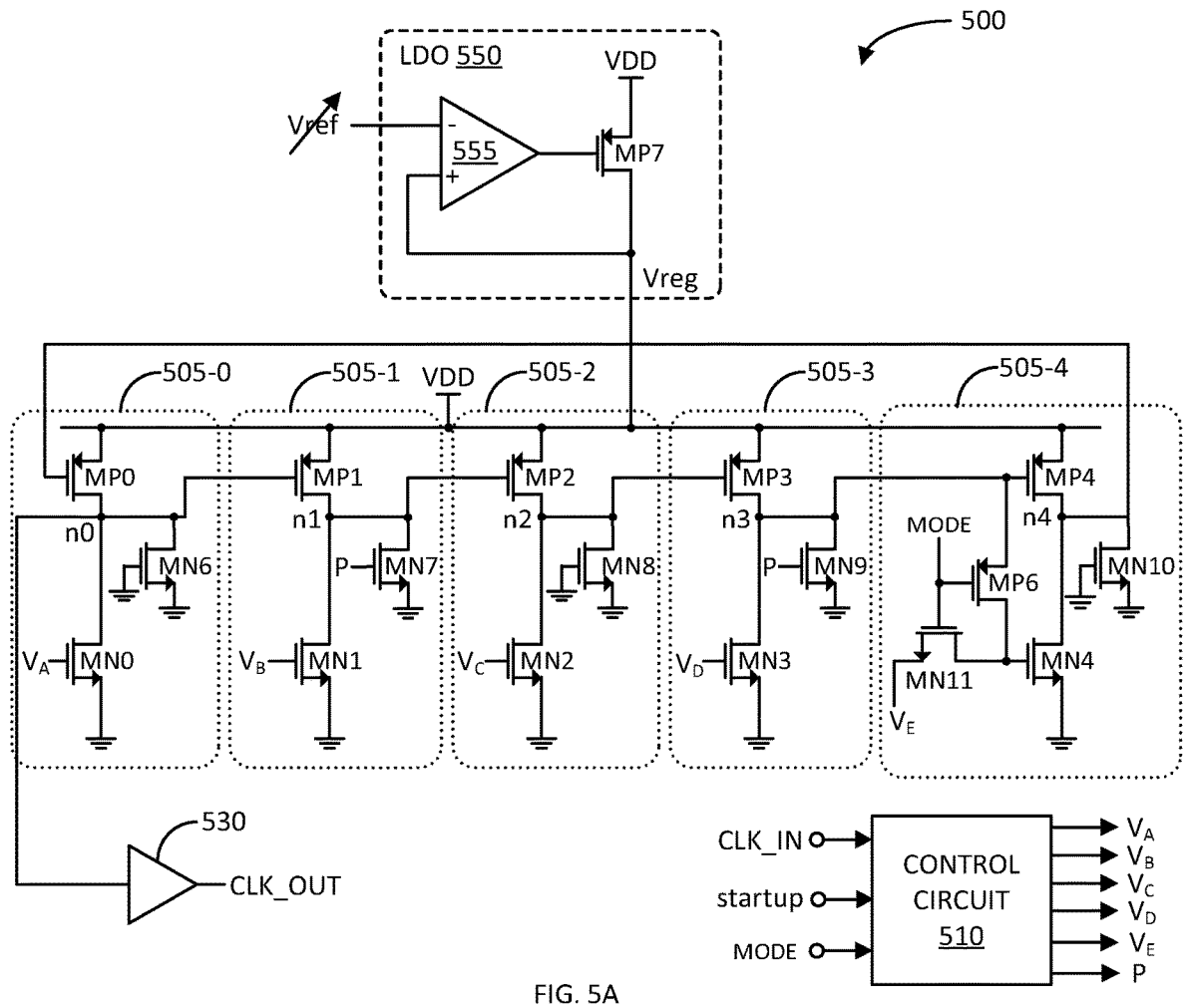
FIG. 5A illustrates a schematic diagram of another example ring oscillator (RO) frequency divider in accordance with another aspect of the disclosure.
FIG. 5B illustrates a table of various operating frequencies and supply voltages in accordance with another aspect of the disclosure.

FIG. 5A illustrates a schematic diagram of another example RO frequency divider 500 in accordance with another aspect of the disclosure. The RO frequency divider 500 is similar to RO frequency divider 400, and includes many of the same elements as indicated by the same labels and reference numbers with the most significant digit (MSD) being a "5" instead of a "4". Subsequent figures will also use this numbering convention. The RO frequency divider 500 further includes a low-dropout (LDO) voltage regulator 550 to selectively change a supply voltage Vreg (a difference in the supply voltage between the first and second voltage rails) provided to the ring of N cascaded inverter stages 505-0 to 505-4 (e.g., N=5 in the illustrated example) using a programmable reference voltage Vref.

More specifically, the LDO voltage regulator 550 includes an operational amplifier 555 and a PMOS FET MP7. The PMOS FET MP7 is coupled between an upper voltage rail VDD and an intermediate voltage rail at the sources of the PMOS FETs MP0 to MP4 of the cascaded inverter stages 505-0 to 505-4. The operational amplifier 555 includes a first (e.g., negative) input to receive the programmable voltage Vref, a second (e.g., positive) input coupled to the intermediate voltage rail, and an output coupled to the gate of the PMOS FET MP7. The LDO voltage regulator 550 is configured to generate and regulate a supply voltage Vreg at the intermediate voltage rail for the cascaded inverter stages 505-0 to 505-4 such that it is substantially the same as the programmable reference voltage Vref.

The supply voltage Vreg effectively sets the range of the operating frequency of the RO frequency divider 500. For example, if a relatively high frequency range or maximum operating frequency is desired, the programmable voltage Vref may be set relatively high to provide a relatively high supply voltage Vreg for the cascaded inverter stages 505-0 to 505-4. The higher supply voltage Vreg reduces the individual delay of each of the cascaded inverter stages 505-0 to 505-4; thereby, allowing the RO frequency divider 500 to operate better at higher frequencies. If a relatively low frequency range or minimum operating frequency is desired, the programmable reference voltage Vref may be set relatively low to provide a relatively low supply voltage Vreg for the cascaded inverter stages 505-0 to 505-4. The lower supply voltage Vreg increases the individual delay of each of the cascaded inverter stages 505-0 to 505-4; thereby, allowing the RO frequency divider 500 to operate better at lower frequencies. In some configurations, the illustrated configuration of the LDO voltage regulator 550 allows for an improved minimum operating frequency without degrading a maximum operating frequency of the RO frequency divider 500. It will be understood that the LDO voltage regulator 550 can be coupled between a voltage rail (e.g., VDD) and the inverter stages of any of the RO frequency dividers illustrated and/or described in this application (e.g., divider 200 or any of the dividers in the following figures).

FIG. 5B illustrates a table of example operating frequencies and supply voltages in accordance with another aspect of the disclosure. The top row represents the supply voltage Vreg in volts (V); the second row from the top represents an example minimum operating frequency when the frequency divider 500 is operated in divide-by-4 mode with the supply voltage in the top row; the third row from the top represents an example maximum operating frequency when the frequency divider 500 is operated in divide-by-4 mode with the supply voltage in the top row; the fourth row from the top represents an example minimum operating frequency when the frequency divider 500 is operated in divide-by-5 mode with the supply voltage in the top row; and the fifth row from the top represents an example maximum operating frequency when the frequency divider 500 is operated in divide-by-5 mode with the supply voltage in the top row.

As the table shows, operating frequencies and/or ranges can be changed by adjusting the supply voltage Vreg. In some examples, if the supply voltage is at 0.5V, the minimum operating frequency for the divide-by-4 and divide-by-5 may be approximately 17.5 GHz, and the maximum operating frequencies for the divide-by-4 and divide-by-5 may be approximately 25 and 32.5 GHz, respectively. Thus, the operating frequency range at Vreg being 0.5V may be at least 17.5 to 25 GHz, and potentially may extend to 32.5 GHz in the illustrated example depending on mode. Considering another example, if the supply voltage is at 0.7V, the minimum operating frequency for the divide-by-4 and divide-by-5 may be approximately 27.5 to 30 GHz, and the maximum operating frequencies for the divide-by-4 and divide-by-5 may be approximately 47.5 and 55 GHz, respectively. Thus, the operating frequency range at Vreg being 0.5V may be at least 27.5 to 47.5 GHz, and potentially may extend to 55 GHz in the illustrated example depending on mode.

It can therefore be seen that the minimum operating frequency in the example illustrated in FIG. 5B can be improved from 30 GHz to 17.5 GHz (e.g., in the divide-by-5 mode) or lower by adjusting the supply voltage. Further, it can be seen that in some embodiments the maximum operating frequency may be as high as 55 GHz or higher. Thus, a minimum operating frequency and/or a maximum operating frequency (and a frequency range) may be improved, for example without adversely affecting the other of the minimum or maximum operating frequency. In some such embodiments, this improved performance may be achieved with the same or lower power consumption as compared to known configurations. Further, in some embodiments, improved operating frequencies may be achieved at lower process nodes as compared to known configurations. For example, embodiments described herein may enable operation at relatively high frequencies (e.g., 50-55 GHz or higher) with a process of 8 nm or smaller (e.g., 8 nanometer (nm) FinFET process technology, such as with 8LPP (Low Power Plus)).

It will be understood that the values described herein are only examples of certain embodiments, and that the frequencies, ranges, supply voltages, process nodes, etc. may vary from those which are illustrated in FIG. 5B and/or described herein. Further, it will be understood that while certain examples are illustrated in FIG. 5B, such examples are not necessarily linked or associated with the example illustrated in FIG. 5A. For example, elements of FIG. 5B may be associated with a configuration that is similar to the divider 200 and/or 400.

Figure 6:
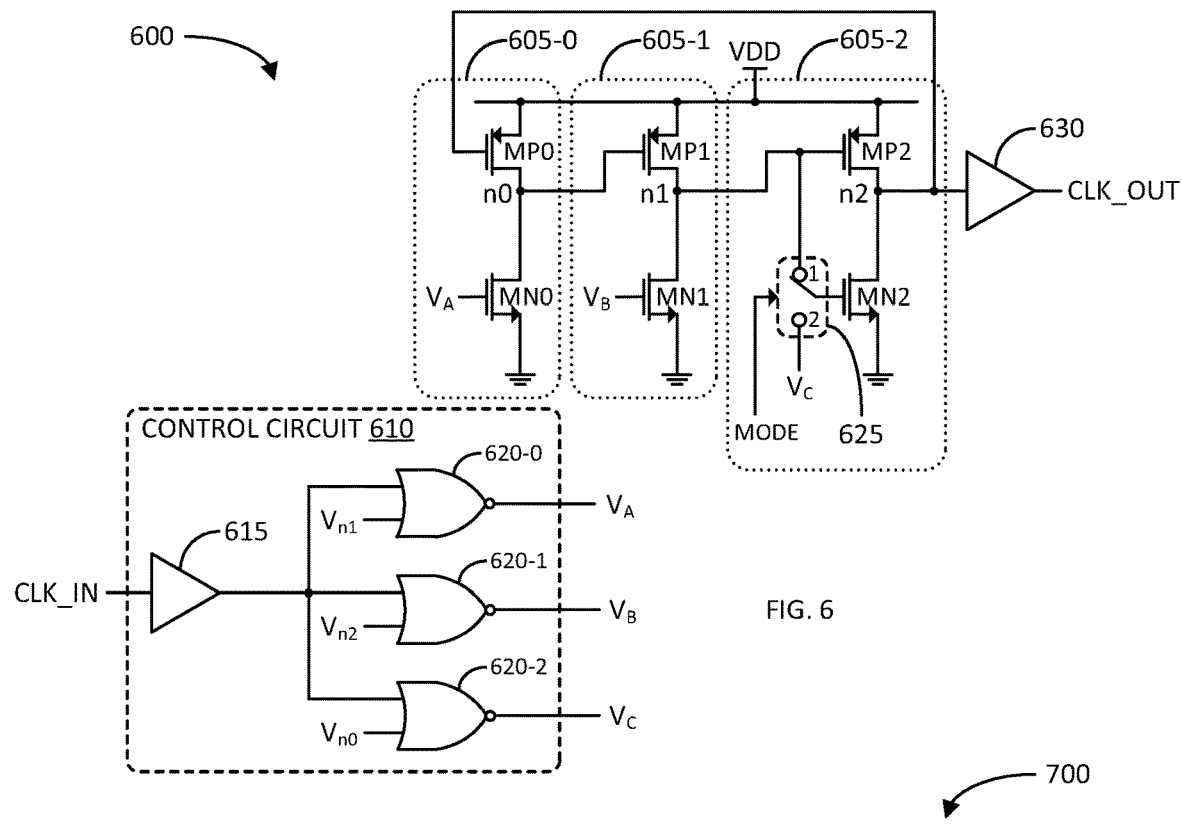
FIG. 6 illustrates a schematic diagram of another example ring oscillator (RO) frequency divider in accordance with another aspect of the disclosure.

FIG. 6 illustrates a schematic diagram of another example ring oscillator (RO) frequency divider 600 in accordance with another aspect of the disclosure. In the previous examples, the RO frequency dividers were configured to perform a divide-by-five or divide-by-four frequency division because the RO frequency dividers had five (5) cascaded inverter stages, which when all are separately clocked, resulted in a divider ratio of five (5) or N, and when the last stage is bypassed or clocked by the phase of the clock provided to the previous stage, resulted in a divide ratio of four (4) or N−1. However, it shall be understood that the RO frequency dividers need not be limited to N being five (5), but could be any other positive integer.

For instance, the RO frequency divider 600 includes a ring of N cascaded inverter stages 605-0 to 605-2 (N=3 in the illustrated example), where each cascaded inverter stage includes a PMOS FET (e.g., MP0-MP2) coupled in series with an NMOS FET (e.g., MN0-MN2) between an upper voltage rail VDD and a lower voltage rail (e.g., ground). In a round robin or modN manner, the gate of the PMOS FET (input) of the $i^{th}$ cascaded inverter stage is coupled to the drain of the PMOS FET (output) of the $i^{th}$−1 (modN) cascaded inverter stage for all stages (e.g., for "i" from zero (0) to N−1). The RO frequency divider 600 includes an output buffer 630 including an input coupled to an output of one of the cascaded inverter stages, such as output node n2 of cascaded inverter stage 605-2, and an output at which an output clock CLK_OUT is produced.

The RO frequency divider 600 further includes a control circuit 610 including an input buffer 615 and a set of N NOR gates 620-0 to 620-2 (N=3). The input buffer 615 includes an input to receive the input clock CLK_IN. The set of NOR gates 620-0 to 620-2 include respective first inputs coupled to an output of the input buffer 615. The set of NOR gates 620-0 to 620-2 include respective second inputs coupled to output nodes n1, n2, and n0 (to receive voltages $V_{n1}$, $V_{n2}$, and $V_{n0}$) of cascaded inverter stages 605-1, 605-2, and 605-0, respectively. The set of NOR gates 620-0 to 620-2 include a set of outputs, at which the control voltages $V_A$, $V_B$, and $V_C$ are generated, coupled to the gates of the NMOS FETs MN0 to MN2 of the cascaded inverter stages 605-0 to 605-2, respectively.

In general, the second input of the $i^{th}$ NOR gate (e.g., 620-i) is coupled to the drain of the PMOS FET (output node) of the $i^{th}$−2 (modN) cascaded inverter stage for "i" from zero (0) to N−1. For example, for i=0, the NOR gate 620-0 includes a second input coupled to the output node n1 (to receive the output voltage $V_{n1}$) of the cascaded inverter stage 605-1, where i−2 (mod3)=0−2 (mod 3)=−2(mod3)=1. Similarly, for i=1, the NOR gate 620-1 includes a second input coupled to the output node n2 (to receive the output voltage $V_{n2}$) of the cascaded inverter stage 605-2, where i−2 (mod3)=1−2 (mod3)=−1(mod3)=2. For i=2, the NOR gate 620-2 includes a second input coupled to the output node n0 (to receive the output voltage $V_{n0}$) of the cascaded inverter stage 605-0, where i−2 (mod3)=2−2 (mod 3)=0(mod3)=0.

However, it will be understood that the control circuit 610 may be implemented with configurations other than what is illustrated in FIG. 6. For example, the control circuit 610 may be implemented with AND gates instead of NOR gates, and the second input of the $i^{th}$ AND gate may be coupled to the drain of the PMOS FET (output node) of the $i^{th}$−1 (modN) cascaded inverter stage for "i" from zero (0) to N−1.

The cascaded inverter stage 605-2 may include a switching device 625 (e.g., a single-pole-double-throw (SPDT)) to selectively couple the gate of the NMOS FET MN2 to the corresponding $V_C$ output of the control circuit 610 or the drain of the PMOS FET MP1 (output) of the previous ($i^{th}$−1) cascaded inverter stage 605-1. More specifically, the SPDT switching device 625 includes a pole coupled to the gate of the NMOS FET MN2, a first throw (labeled "1") coupled to the drain of the PMOS FET MP1 (output) of the previous ($i^{th}$−1) cascaded inverter stage 605-1, and a second throw (labeled "2") coupled to the $V_C$ output of the control circuit 610.

The SPDT switching device 625 includes a control input to receive a divider ratio mode signal. If the mode signal sets the SPDT device 625 to couple the pole to the second throw, the RO frequency divider 600 divides the frequency of the input clock CLK_IN by three (3) or N to generate the output clock CLK_OUT (e.g., the divider ratio is three (3)). If the mode signal sets the SPDT device 625 to couple the pole to the first throw, the RO frequency divider 600 divides the frequency of the input clock CLK_IN by two (2) or N−1 to generate the output clock CLK_OUT (e.g., the divider ratio is three (2)). Thus, in this example, the RO frequency divider 600 is a dual-modulus or multi-modulus frequency divider.

Figure 7:
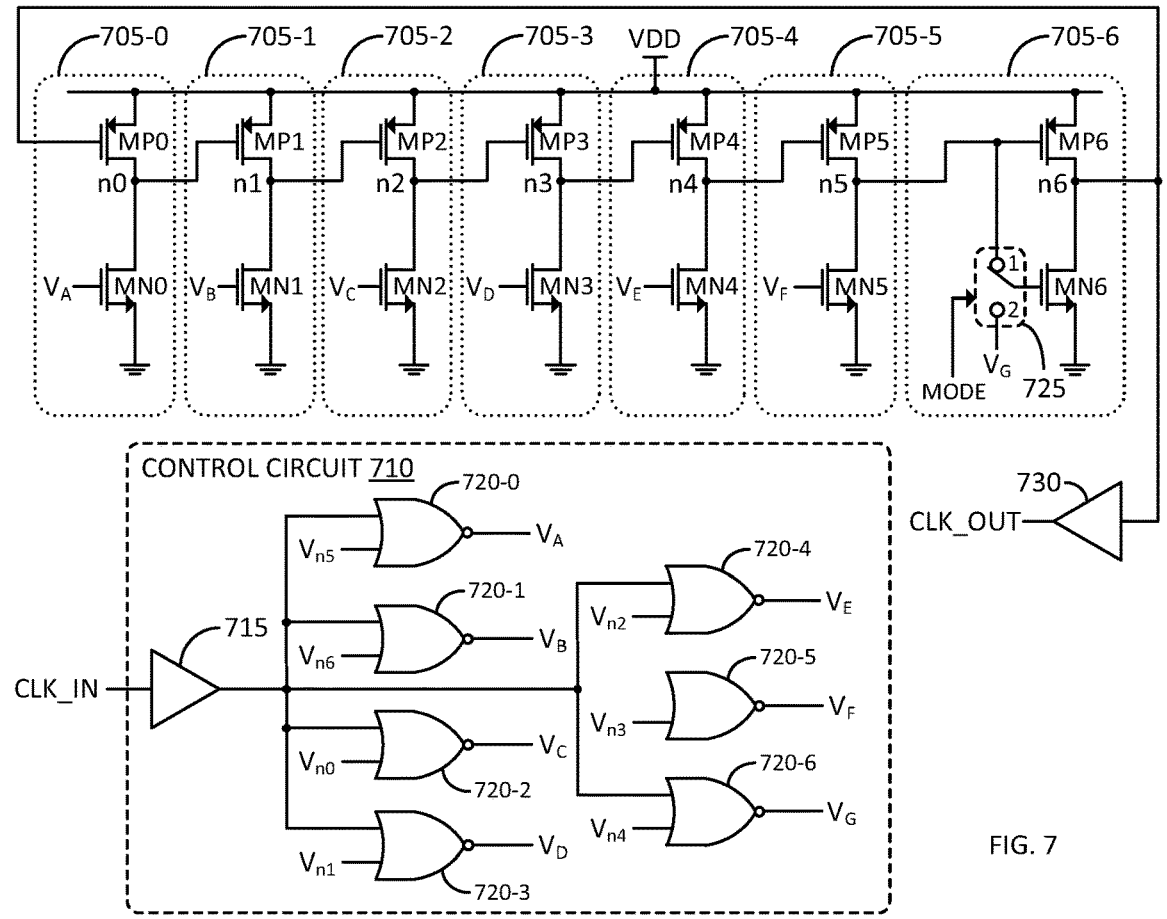
FIG. 7 illustrates a schematic diagram of another example ring oscillator (RO) frequency divider in accordance with another aspect of the disclosure.

FIG. 7 illustrates a schematic diagram of another example ring oscillator (RO) frequency divider 700 in accordance with another aspect of the disclosure. The RO frequency divider 700 is an example of an N=7 cascaded inverter stage implementation. In particular, the RO frequency divider 700 includes a ring of N cascaded inverter stages 705-0 to 705-6 (N=7 in the illustrated example), where each cascaded inverter stage includes a PMOS FET (e.g., MP0-MP6) coupled in series with an NMOS FET (e.g., MN0-MN6) between an upper voltage rail VDD and a lower voltage rail (e.g., ground). In a round robin or modN manner, the gate of the PMOS FET (input) of the $i^{th}$ cascaded inverter stage is coupled to the drain of the PMOS FET (output) of the $i^{th}$−1 (modN) cascaded inverter stage for all stages (e.g., for "i" from zero (0) to N−1). The RO frequency divider 700 includes an output buffer 730 including an input coupled to an output of one of the cascaded inverter stages, such as output node n6 of cascaded inverter stage 705-6, and an output at which an output clock CLK_OUT is produced.

The RO frequency divider 700 further includes a control circuit 710 including an input buffer 715 and a set of N NOR gates 720-0 to 720-6 (N=7). The input buffer 715 includes an input to receive the input clock CLK_IN. The set of NOR gates 720-0 to 720-6 include respective first inputs coupled to an output of the input buffer 715. The set of NOR gates 720-0 to 720-6 include respective second inputs coupled to output nodes n5, n6, n0, n1, n2, n3, and n4 of cascaded inverter stages 705-5, 705-6, 705-0 to 705-4, respectively. The set of NOR gates 720-0 to 720-6 include a set of outputs, at which the control voltages $V_A$ to $V_G$ are generated, coupled to the gates of the NMOS FETs MN0 to MN6 of the cascaded inverter stages 705-0 to 705-6, respectively.

In general, as previously discussed, the second input of the $i^{th}$ NOR gate (e.g., 720-i) is coupled to the drain of the PMOS FET (output node) of the $i^{th}$−2 (modN) cascaded inverter stage for "i" from zero (0) to N−1. Considering some examples, for i=0, the NOR gate 720-0 includes a second input coupled to the output node n5 (to receive the output voltage $V_{n5}$) of the cascaded inverter stage 705-5, where i−2 (mod7)=0−2 (mod7)=−2(mod7)=5. Similarly, for i=1, the NOR gate 720-1 includes a second input coupled to the output node n6 (to receive the output voltage $V_{n6}$) of the cascaded inverter stage 705-6, where i−2 (mod7)=1−2 (mod7)=−1(mod7)=6. For i=2, the NOR gate 720-2 includes a second input coupled to the output node n0 (to receive the output voltage $V_{n0}$) of the cascaded inverter stage 705-0, where i−2 (mod7)=2−2 (mod7)=0(mod7)=0; and so on.

However, it will be understood that the control circuit 710 may be implemented with configurations other than what is illustrated in FIG. 7. For example, the second input of the $i^{th}$ NOR gate (e.g., 720-i) may be coupled to the drain of the PMOS (and NMOS) FET (output) of the $i^{th}$−4 (modN) cascaded inverter stage for "i" from zero (0) to N−1 in some embodiments. In some embodiments, the second input of the $i^{th}$ NOR gate is coupled to the drain of the PMOS (and NMOS) FET (output) of the $i^{th}$−E (modN) cascaded inverter stage for "i" from zero (0) to N−1, where E is even and 0<E<N. As another example, the control circuit 710 may be implemented with AND gates instead of NOR gates. The second input of the $i^{th}$ AND gate may be coupled to the drain of the PMOS FET (output node) of the $i^{th}$−1 (modN) cascaded inverter stage for "i" from zero (0) to N−1 in some embodiments, the $i^{th}$−3 (modN) cascaded inverter stage for "i" from zero (0) to N−1 in other embodiments, or the $i^{th}$−5 (modN) cascaded inverter stage for "i" from zero (0) to N−1 in yet other embodiments. In some embodiments, the second input of the $i^{th}$ AND gate is coupled to the drain of the PMOS (and NMOS) FET (output) of the $i^{th}$–R (modN) cascaded inverter stage for "i" from zero (0) to N−1, where R is odd and 0<R<N.

The cascaded inverter stage 705-6 may include a switching device 725 (e.g., an SPDT) to selectively couple the gate of the NMOS FET MN6 to the corresponding $V_G$ output of the control circuit 710 or the drain of the PMOS FET MP5 (output) of the previous ($i^{th}$−1) cascaded inverter stage 705-5. More specifically, the SPDT switching device 725 includes a pole coupled to the gate of the NMOS FET MN6, a first throw (labeled "1") coupled to the drain of the PMOS FET MP5 (output) of the previous ($i^{th}$−1) cascaded inverter stage 705-5, and a second throw (labeled "2") coupled to the $V_G$ output of the control circuit 710.

The SPDT switching device 725 includes a control input to receive a divider ratio mode signal. If the divider ratio mode signal sets the SPDT device 725 to couple the pole to the second throw, the RO frequency divider 700 divides the frequency of the input clock CLK_IN by seven (7) or N to generate the output clock CLK_OUT (e.g., the divider ratio is seven (7)). If the divider ratio mode signal sets the SPDT device 725 to couple the pole to the first throw, the RO frequency divider 700 divides the frequency of the input clock CLK_IN by six (6) or N−1 to generate the output clock CLK_OUT (e.g., the divider ratio is six (6)). Thus, in this example, the RO frequency divider 700 is a dual-modulus or multi-modulus frequency divider.

Figure 8:
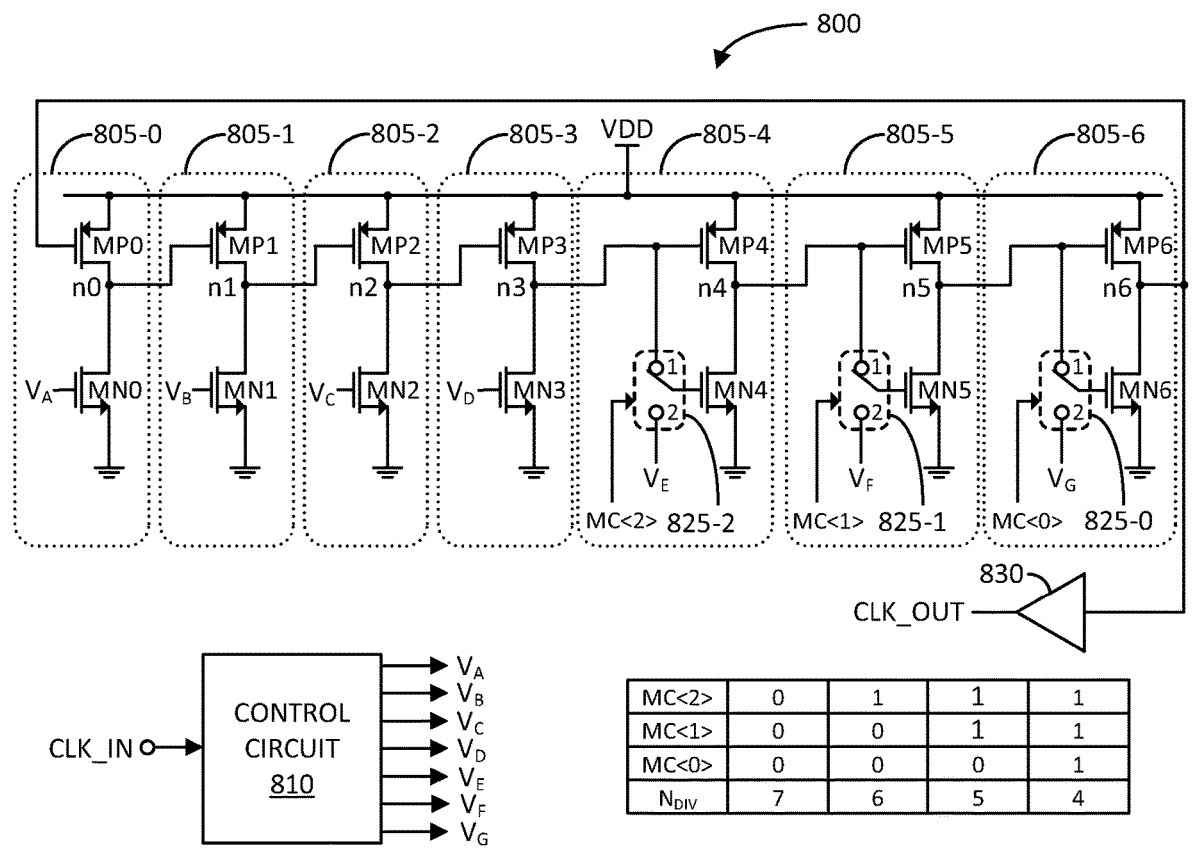
FIG. 8 illustrates a schematic diagram of another example ring oscillator (RO) frequency divider in accordance with another aspect of the disclosure.

FIG. 8 illustrates a schematic diagram of an example multi-modulus RO frequency divider 800 and associated mode table in accordance with another aspect of the disclosure. The previous RO frequency dividers discussed were either single division dividers, or dual-modulus dividers as they provide two selectable divide ratios N and N−1. In contrast, the RO frequency divider 800 includes N=7 stages with a subset of the stages 4-6 being selectively bypassed to achieve additional divider ratios 4-6 or N−3 to N−1.

In particular, the RO frequency divider 800 includes a ring of N cascaded inverter stages 805-0 to 805-6 (N=7), where each cascaded inverter stage includes a PMOS FET (e.g., MP0-MP6) coupled in series with an NMOS FET (e.g., MN0-MN6) between an upper voltage rail VDD and a lower voltage rail (e.g., ground). In a round robin or modN manner, the gate of the PMOS FET (input) of the $i^{th}$ cascaded inverter stage is coupled to the drain of the PMOS FET (output) of the $i^{th}$−1 (modN) cascaded inverter stage for all stages (e.g., for "i" from zero (0) to N−1). The RO frequency divider 800 includes an output buffer 830 including an input coupled to an output of one of the cascaded inverter stages, such as output node n6 of cascaded inverter stage 805-6, and an output at which an output clock CLK_OUT is produced.

The RO frequency divider 800 further includes a control circuit 810 including an input to receive an input clock CLK_IN, and a set of N independent outputs to produce control voltages $V_A$ to $V_G$, respectively. The set of N independent outputs of the control circuit 810 are coupled to the gates of the NMOS FETs MN0 to MN6 of the cascaded inverter stages 805-0 to 805-6, respectively.

In this example, the cascaded inverter stages 805-4 to 805-6 include switching devices 825-2 to 825-0 (e.g., each configured as an SPDT) to selectively couple the gates of the NMOS FETs MN4 to MN6 to the corresponding $V_E$ to $V_G$ outputs of the control circuit 810 or the drains of the PMOS FETs MP3 to MP5 (outputs) of their respective previous ($i^{th}$−1) cascaded inverter stages 805-3 to 805-5, respectively. More specifically, the SPDT switching devices 825-2 to 825-0 include poles coupled to the gates of the NMOS FETs MN4 to MN6, first throws (labeled "1") coupled to the drains of the PMOS FET MP3 to MP5 (outputs) of the previous ($i^{th}$−1) cascaded inverter stages 805-3 to 805-5, and second throws (labeled "2") coupled to the $V_E$ to $V_G$ outputs of the control circuit 810, respectively.

The SPDT switching devices 825-0 to 825-2 include control inputs to receive different bits MC<0> to MC<2> of a divider ratio mode signal in the illustrated embodiment. Referring to a mode table provided in FIG. 8, if the bits MC<0> to MC<2> of the mode signal are 000, the RO frequency divider 800 divides the frequency of the input clock CLK_IN by seven (7) or N to generate the output clock CLK_OUT (e.g., the divider ratio $N_{DIV}$ is seven (7)). If the bits MC<0> to MC<2> of the mode signal are 100, the RO frequency divider 800 divides the frequency of the input clock CLK_IN by six (6) or N−1 to generate the output clock CLK_OUT (e.g., the divider ratio $N_{DIV}$ is six (6)). If the bits MC<0> to MC<2> of the mode signal are 110, the RO frequency divider 800 divides the frequency of the input clock CLK_IN by five (5) or N−2 to generate the output clock CLK_OUT (e.g., the divider ratio $N_{DIV}$ is five (5)). If the bits MC<0> to MC<2> of the mode signal are 111, the RO frequency divider 800 divides the frequency of the input clock CLK_IN by four (4) or N−3 to generate the output clock CLK_OUT (e.g., the divider ratio $N_{DIV}$ is four (4)). In other embodiments (not illustrated), the switching devices 825-0 to 825-2 may each receive separate or independent control signals.

Figure 9:
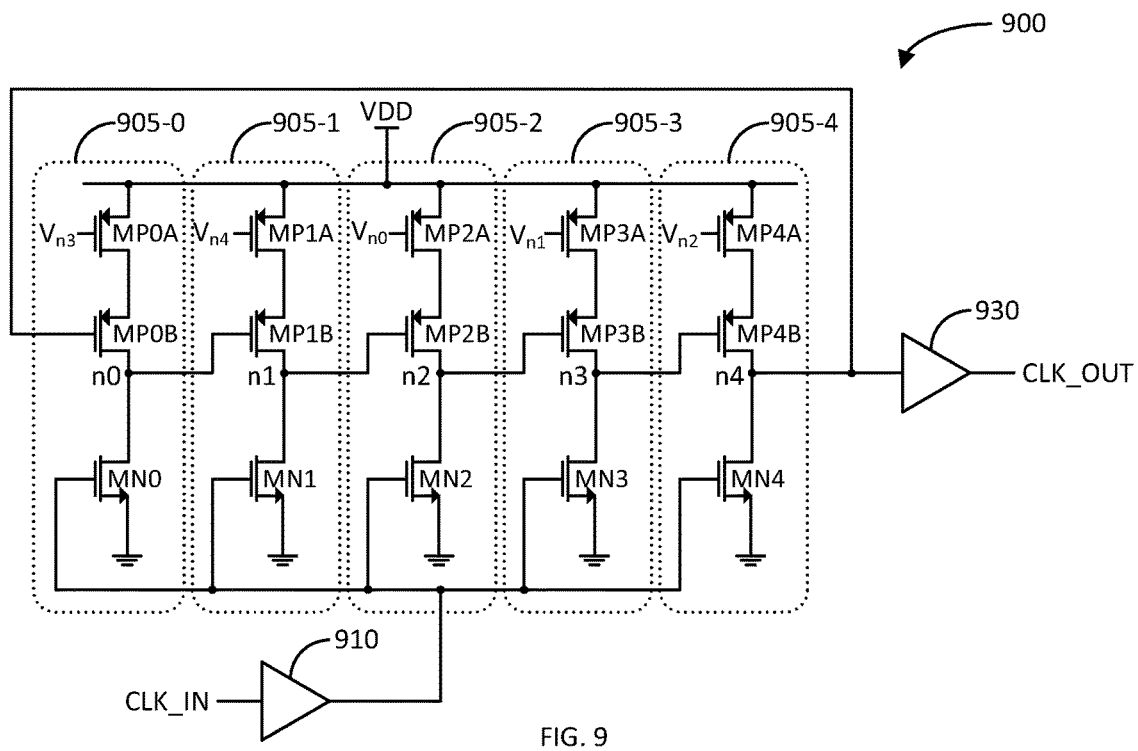
FIG. 9 illustrates a schematic diagram of another example ring oscillator (RO) frequency divider in accordance with another aspect of the disclosure.

FIG. 9 illustrates a schematic diagram of another example RO frequency divider 900 in accordance with another aspect of the disclosure. In summary, the RO frequency divider 900 includes differently configured cascaded inverter stages that effectively eliminates the control circuit of the previous implementations. More specifically, the RO frequency divider 900 includes a ring of N-cascaded inverter stages 905-0 to 905-4 (N=5 in the illustrated example), where each stage includes a first PMOS FET, a second PMOS FET, and an NMOS FET coupled in series between an upper voltage rail VDD and a lower voltage rail (e.g., ground). A greater or fewer number of stages may be implemented in other embodiments.

For example, cascaded inverter stage 905-0 includes first and second PMOS FETs MP0A and MP0B, and NMOS FET MN0; cascaded inverter stage 905-1 includes first and second PMOS FETs MP1A and MP1B, and NMOS FET MN1; cascaded inverter stage 905-2 includes first and second PMOS FETs MP2A and MP2B, and NMOS FET MN2; cascaded inverter stage 905-3 includes first and second PMOS FETs MP3A and MP3B, and NMOS FET MN3; and cascaded inverter stage 905-4 includes first and second PMOS FETs MP4A and MP4B, and NMOS FET MN4.

In a round robin or modN manner, the gate of the second PMOS FET of the $i^{th}$ cascaded inverter stage is coupled to the drain of the second PMOS FET (and the drain of the NMOS FET) of the $i^{th}$−1 (modN) cascaded inverter stage for all stages (e.g., for i from zero (0) to N−1). Additionally, in a round robin or modN manner, the gate of the first PMOS FET of the $i^{th}$ cascaded inverter stage is coupled to the drain of the second PMOS FET of the $i^{th}$−2 (modN) cascaded inverter stage for all stages (e.g., for i from zero (0) to N−1). In other embodiments (not illustrated), in a round robin or modN manner, the gate of the first PMOS FET of the $i^{th}$ cascaded inverter stage may be coupled to the drain of the second PMOS FET of the $i^{th}$−4 (modN) cascaded inverter stage for all stages (e.g., for i from zero (0) to N−1).

The RO frequency divider 900 includes an input buffer 910 including an input to receive an input clock CLK_IN, and an output coupled to the gates of the NMOS FETs MN0 to MN4, respectively. Accordingly, the rising edge or high state of the input clock CLK_IN simultaneously turn on the NMOS FETs MN0 to MN4. However, due to the coupling of the gates of the first PMOS FETs MP0A to MP4A to output nodes n3, n4, n0, n1, and n2, respectively, the cascaded inverter stages 905-0 to 905-5 are enabled substantially one at a time per each clock cycle. The stage that is enabled per clock cycle would be the one with the first and second PMOS FETs being turned off.

Additionally, the RO frequency divider 900 includes an output buffer 930 including an input coupled to one of the outputs of the N cascaded inverter stages, such as output node n4 of cascaded inverter stage 905-4. The output buffer 930 includes an output at which an output clock CLK_OUT is produced. The RO frequency divider 900 is configured to frequency divide the input clock CLK_OUT by five (5) or N to generate the output clock CLK_OUT. While not illustrated in FIG. 9, the RO frequency divider 900 may be implemented as a multi-modulus frequency divider using one or more switching devices, as described with respect to various examples above.

Figure 10A:
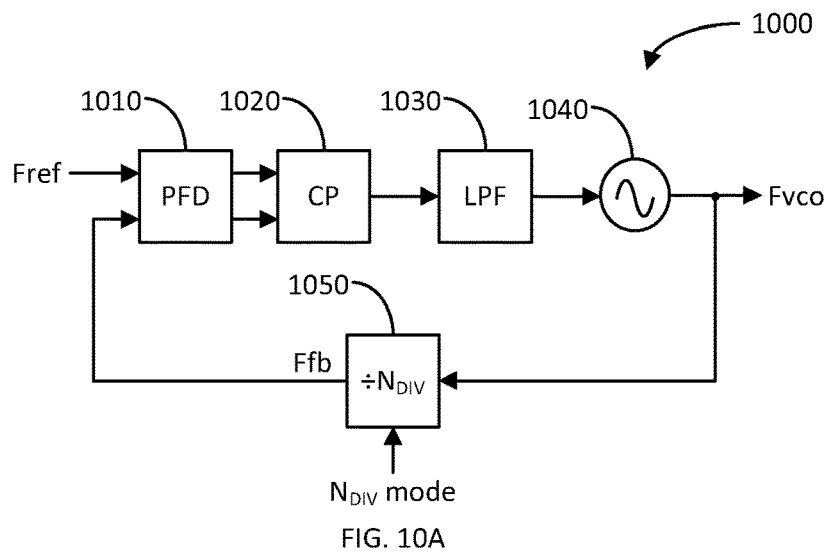
FIG. 10A illustrates a block diagram of an example phase locked loop (PLL) in accordance with another aspect of the disclosure.

FIG. 10A illustrates a block diagram of an example phase locked loop (PLL) 1000 in accordance with another aspect of the disclosure. Any of the ring oscillator (RO) frequency dividers previously discussed may be used in a feedback loop of a PLL, such as PLL 1000. In such case, an RO frequency divider may be referred to as a frequency prescaler with dual- or multi-modulus frequency division functionality.

In particular, the PLL 1000 includes a phase-frequency detector (PFD) 1010, a charge pump (CP) 1020, a low pass filter (LPF) 1030, a voltage controlled oscillator (VCO) 1040, and a frequency divider ($\div N_{DIV}$) 1050. The frequency divider 1050 may include any of the RO frequency dividers previously discussed. Accordingly, the frequency divider 1050 is situated in a feedback loop of the PLL 1000 to frequency divide a clock Fvco generated by the VCO 1040 by a divider ratio $N_{DIV}$ set by a divider ratio mode signal to generate a feedback clock Ffb, which may serve as CLK_OUT of the frequency divider 1050.

As discussed further herein, the frequency divider 1050 may include a dual-modulus divider configured to frequency divide by either $N_{DIV}$=4 or 5 based on the divider ratio mode signal. The divider ratio mode signal may be generated by a sequence generator, such as a sigma-delta modulator, to achieve a fractional frequency division by the frequency divider 1050. For example, if the target frequency division is 4.5, then the divider ratio mode signal may be a sequence having a mean of 0.5 (e.g., causing the frequency divider 1050 to divide-by-five (5) for half the sequence period and divide-by-four (4) for the other half of the sequence period). If the target frequency division is 4.2, then the divider ratio mode signal may be a sequence having a mean of 0.2 (e.g., causing the frequency divider 1050 to divide-by-five (5) 80 percent of the sequence period and divide-by-four (4) 20 percent of the sequence period). In other embodiments, the frequency divider 1050 is a single modulus divider.

The PFD 1010 compares the phase-frequency of the feedback clock Ffb to the phase-frequency of a reference clock Fref, and generates a phase-frequency error signal. The CP 1020 charges and discharges a capacitor based on the phase-frequency error signal to generate a charge pump voltage related to the phase-frequency error. The LPF 1030 filters the charge pump voltage to remove high frequency components therefrom to generate a control voltage for the VCO 1040. The VCO 1040 generates the clock Fvco based on the control voltage. When the loop is locked, the phase-frequency of the feedback signal Ffb is substantially the same as the phase-frequency of the reference signal Fref, and the frequency of the VCO clock Fvco is $N_{DIV}$ times the frequency of the reference clock Fref.

Figure 10B:
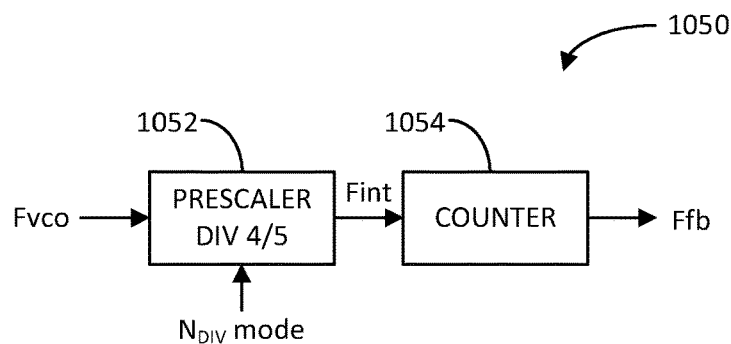
FIG. 10B illustrates a block diagram of an example divide-by-N frequency divider of the phase locked loop (PLL) of FIG. 10A in accordance with another aspect of the disclosure.

FIG. 10B illustrates a block diagram of an example of the frequency divider 1050 of the phase locked loop (PLL) 1000 in accordance with another aspect of the disclosure. The frequency divider 1050 includes a frequency prescaler 1052 (e.g., DIV 4/5), which may be configured per any of the RO frequency dividers previously discussed. Accordingly, the frequency prescaler 1052 is configured to frequency divide the clock Fvco of the VCO 1040 based on the divider ratio mode signal to generate an intermediate clock Fint. Thus, an output of the VCO 1040 may serve as CLK_IN for the frequency divider 1050/frequency prescaler 1052. The frequency divider 1050 further includes a counter 1054 configured to generate the feedback clock Ffb based on the intermediate clock Fint. The counter 1054 may be a modulo-Q counter, which essentially operates as a frequency divider to divide the frequency of the intermediate clock Fint by the modulo-Q. A CLK_OUT of the prescaler 1052 may be provided to the counter 1054.

Figure 11:
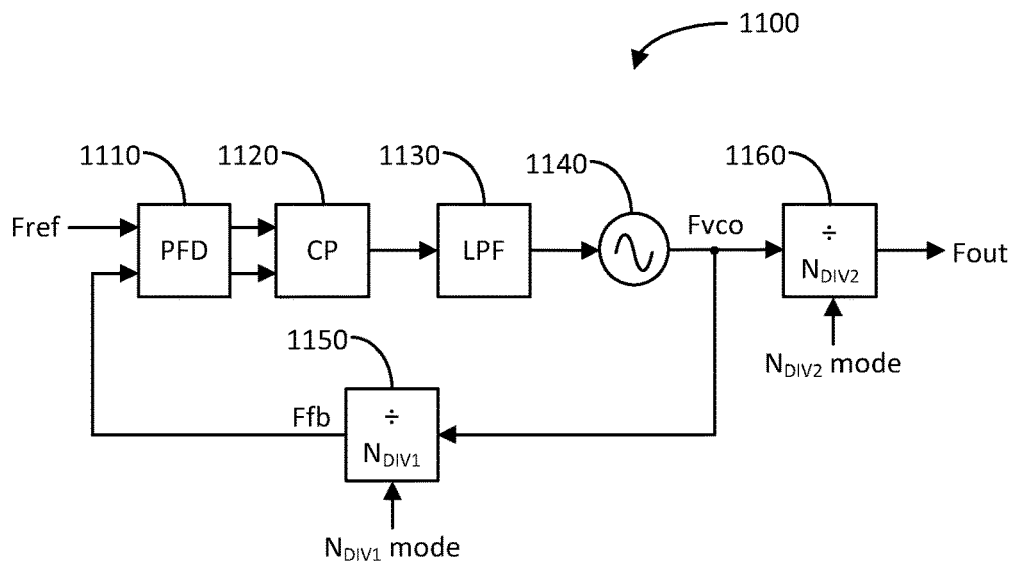
FIG. 11 illustrates a block diagram of another example phase locked loop (PLL) in accordance with another aspect of the disclosure.

FIG. 11 illustrates a block diagram of another example phase locked loop (PLL) 1100 in accordance with another aspect of the disclosure. The PLL 1100 is similar to PLL 1000 previously discussed, including a phase-frequency detector (PFD) 1110, a charge pump 1120, a low pass filter 1130, a voltage controlled oscillator (VCO) 1140, and a frequency divider 1150. The frequency divider 1150 in the feedback loop of the PLL 1100 is configured to frequency divide the frequency of the VCO clock Fvco by a first divider ratio $N_{DIV1}$ based on a first divider ratio mode signal to generate the feedback clock Ffb, as discussed with reference to PLL 1000.

The PLL 1100 further includes an additional frequency divider 1160 configured to frequency divide the clock Fvco of the VCO 1140 by a second divider ratio $N_{DIV2}$ based on a second divider ratio mode signal to generate an output clock Fout. The frequency divider 1160 may be configured per any of the RO frequency dividers previously discussed. Thus, an output of the VCO 1140 may serve as CLK_IN for the frequency divider 1160. In this example, the frequency divider 1160 is not in the feedback loop of the PLL 1100. In some such examples the frequency divider 1160 is included in a local oscillator (LO) divider, and CLK_OUT of the divider is provided to another portion of the LO or to a mixer. Thus, the RO frequency dividers described herein may be used in many applications and in various functions or locations throughout a device.

Figure 12:
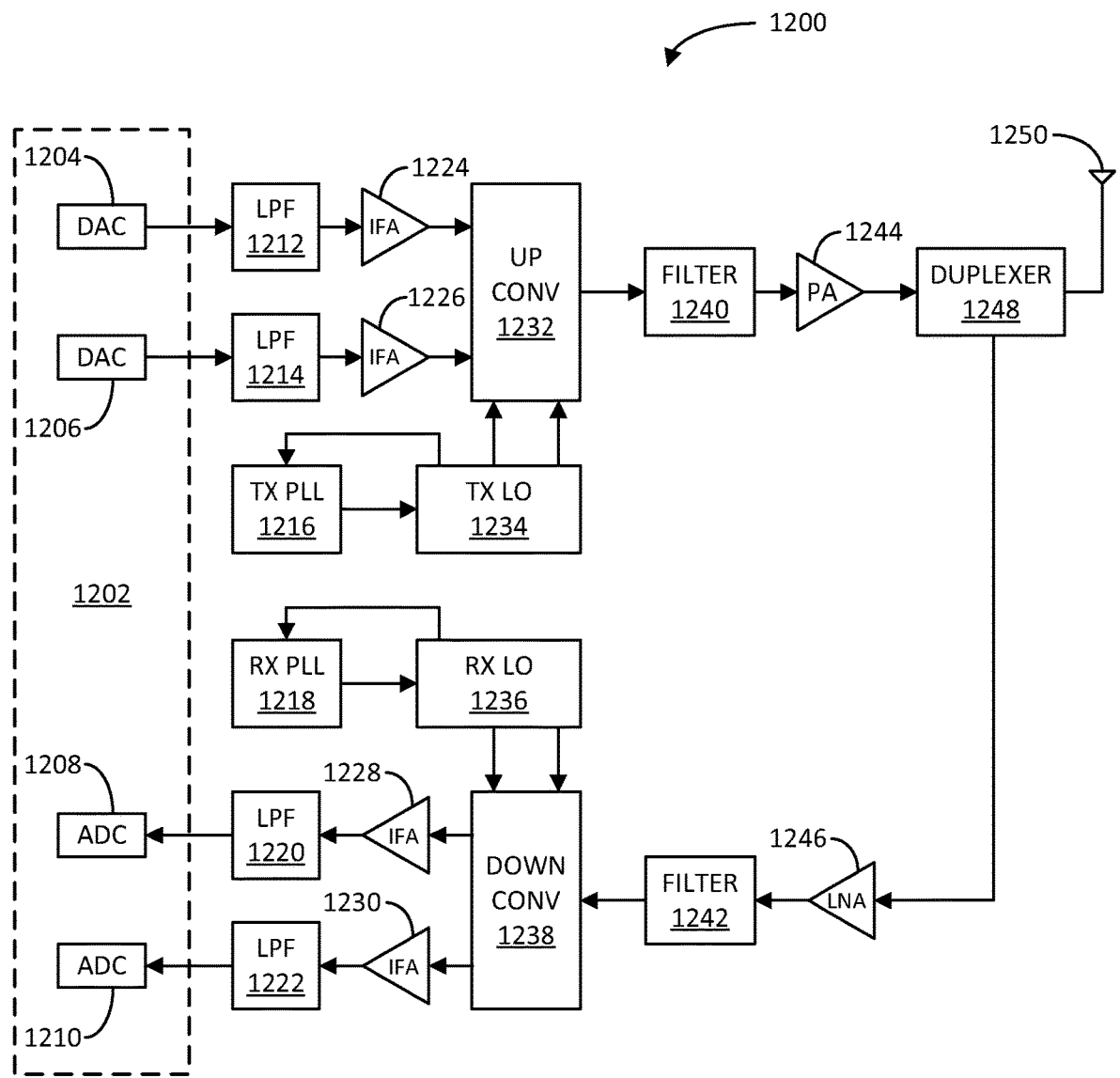
FIG. 12 Illustrates a block diagram of an example wireless communication device in accordance with another aspect of the disclosure.

FIG. 12 illustrates a block diagram of an example wireless communication device 1200 in accordance with another aspect of the disclosure. As discussed, the RO frequency dividers described herein may be used in many applications, including those in a transceiver of a wireless communication device, such as wireless communication device 1200. The wireless communication device 1200 includes a digital signal processing core 1202 including a set of one or more digital-to-analog converters (DACs) 1204 and 1206, and a set of one or more analog-to-digital converters (ADCs) 1208 and 1210. The digital signal processing core 1202 may set or adjust the programmable reference voltage Vref in some embodiments.

The wireless communication device 1200 further includes a set of one or more low pass filters (LPFs) 1212 and 1214, a set of or more amplifiers 1224 and 1226, an up-converter 1232, a transmitter (Tx) phase locked loop (PLL) 1216, a transmitter (Tx) local oscillator (LO) 1234, a radio frequency (RF) filter 1240, a power amplifier (PA) 1244, a duplexer 1248, and at least one antenna 1250.

The wireless communication device 1200 further includes a low noise amplifier (LNA) 1246, an RF filter 1242, a downconverter 1238, a receiver (Rx) phase locked loop (PLL) 1218, a receiver (Rx) local oscillator (LO) 1236, a set of one or more amplifiers 1228 and 1230, and a set of one or more low pass filters (LPFs) 1220 and 1222.

Any of the RO frequency dividers described herein may be used in the transmitter (Tx) PLL 1216 and/or receiver (Rx) PLL 1218. For example, the transmitter (Tx) LO 1234 may provide a divider ratio mode signal to the Tx PLL 1216 to cause the PLL to generate an output clock with a particular frequency. In other examples, the divider ratio mode signal may be provided by another component or circuitry, for example the processor/core 1202. The divider ratio mode signal controls the divider ratio of the RO frequency divider in the Tx PLL 1216. The Tx LO 1234 uses the output clock of the Tx PLL 1216 to generate a transmit LO for the up-converter 1232.

Similarly, the receiver (Rx) LO 1236 (or the processor/core 1202) may provide divider ratio mode signals to the Rx PLL 1218 to cause the PLL to generate an output clock with a particular frequency. The divider ratio mode signal controls the divider ratio of the RO frequency divider in the Rx PLL 1218. The Rx LO 1236 uses the output clock of the Rx PLL 1218 to generate a receive LO for the downconverter 1238.

Further, any of the RO frequency dividers described herein may be used in the transmitter (Tx) LO 1234 and/or the receiver (Rx) LO 1236. The RO frequency dividers may be used in any other circuit in the wireless device 1200 which implements a frequency divider.

Figure 13:
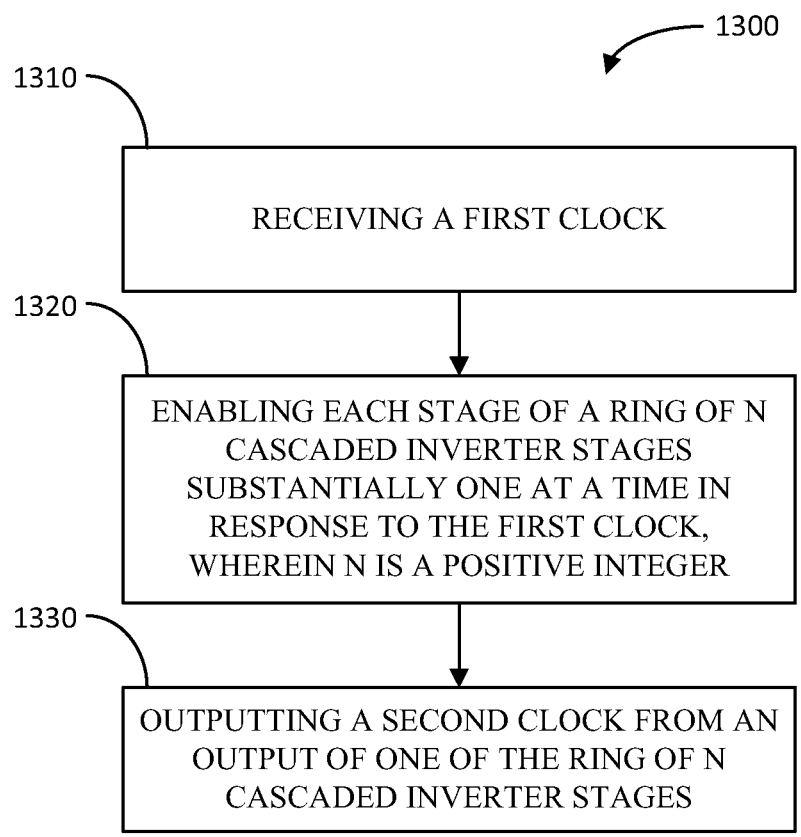
FIG. 13 illustrates a flow diagram of an example method of frequency dividing a first clock to generate a second clock in accordance with another aspect of the disclosure.

FIG. 13 illustrates a flow diagram of an example method 1300 of frequency dividing a first clock to generate a second clock in accordance with another aspect of the disclosure. The method 1300 includes receiving a first clock (block 1310); enabling each stage of a ring of N cascaded inverter stages substantially one at a time in response to the first clock (block 1320); and outputting a second clock from an output of one of the ring of N cascaded inverter stages, wherein N is a positive integer (block 1330).

The following provides an overview of aspects of the present disclosure:

Aspect 1: An apparatus, including: a ring of N cascaded inverter stages, wherein N is a positive integer; and a control circuit including a set of N independent outputs coupled to the ring of N cascaded inverter stages, respectively.

Aspect 2: The apparatus of aspect 1, wherein the control circuit is configured to generate a set of N control signals at the set of N independent outputs, respectively, to enable each of the N cascaded inverter stages substantially one at a time in response to a first clock, wherein a second clock is generated at an output of one of the N cascaded inverter stages, and wherein a divider ratio of a frequency of the first clock to a frequency of the second clock is an integer of N or less.

Aspect 3: The apparatus of aspect 2, wherein each stage of the ring of N cascaded inverter stages includes a p-channel metal oxide semiconductor field effect transistor (PMOS FET) coupled in series with an n-channel metal oxide semiconductor field effect transistor (NMOS FET) between first and second voltage rails, each of the NMOS FETs comprising a gate, wherein the PMOS FET of the $i^{th}$ cascaded inverter stage includes a gate coupled to a drain of the PMOS FET of the $i^{th}-1$ (mod N) cascaded inverter stage for integer i from zero (0) to N−1, and wherein the set of N independent outputs of the control circuit are coupled to the gates of the NMOS FETs of the ring of N cascaded inverter stages, respectively.

Aspect 4: The apparatus of aspect 3, wherein the control circuit includes: a set of N NOR gates with outputs serving as the set of N independent outputs of the control circuit, respectively, wherein each of the set of N NOR gates includes a first input to receive the first clock, and wherein the $i^{th}$ NOR gate includes a second input coupled to the drain of the PMOS FET of the $i^{th}-E$ (mod N) cascaded inverter stage for i from zero (0) to N−1, wherein E is an even positive integer less than N; or a set of N AND gates with outputs serving as the set of N independent outputs of the control circuit, respectively, wherein each of the set of N AND gates includes a first input to receive the first clock, and wherein the $i^{th}$ AND gate includes a second input coupled to the drain of the PMOS FET of the $i^{th}-R$ (mod N) cascaded inverter stage for i from zero (0) to N−1, wherein R is an odd positive integer less than N.

Aspect 5: The apparatus of aspect 3 or 4, wherein a subset of one or more of the N cascaded inverter stages each includes a switching device to selectively couple the gate of the NMOS FET of the $j^{th}$ cascaded inverter stage of the subset to either the $j^{th}$ output of the control circuit or the drain of the PMOS FET of the $j^{th}-1$ cascaded inverter stage for integer j from zero (0) to a number of one or more cascaded inverter stages in the subset, wherein the switching device selectively couples based on a divider ratio mode signal.

Aspect 6: The apparatus of aspect 5, wherein a divider ratio of a frequency of the first clock to a frequency of the second clock is greater when the gate of the NMOS FET of the $j^{th}$ cascaded inverter stage is coupled to the $j^{th}$ output of the control circuit than when the gate of the NMOS FET of the $j^{th}$ cascaded inverter stage is coupled to the drain of the PMOS FET of the $j^{th}-1$ cascaded inverter stage.

Aspect 7: The apparatus of aspect 5 or 6, wherein the switching device includes: a second PMOS FET coupled between the drain of the PMOS FET of the $j^{th}-1$ cascaded inverter stage and the gate of the NMOS FET of the $j^{th}$ cascaded inverter stage; and a second NMOS FET coupled between the gate of the NMOS FET of the $j^{th}$ cascaded inverter stage and the $j^{th}$ output of the control circuit, wherein gates of the second PMOS FET and the second NMOS FET are coupled together to receive the divider ratio mode signal.

Aspect 8: The apparatus of any one of aspects 3-7, wherein one or more of every other N-cascaded inverter stage includes a second NMOS FET coupled between the drain of the corresponding PMOS FET and the second voltage rail, wherein the second NMOS FET includes a gate to receive a pre-discharging signal.

Aspect 9: The apparatus of aspect 8, wherein one or more of every other N cascaded inverter stage not including the second NMOS FET includes a dummy NMOS FET coupled between the corresponding PMOS FET and the second voltage rail, wherein the dummy NMOS includes a gate coupled to the second voltage rail.

Aspect 10: The apparatus of any one of aspects 1-9, wherein the N cascaded inverter stages are coupled between a first voltage rail and a second voltage rail, and further including a voltage regulator to selectively change a difference in a supply voltage between the first and second voltage rails.

Aspect 11: The apparatus of aspect 10, wherein the voltage regulator includes a low-dropout (LDO) voltage regulator.

Aspect 12: The apparatus of aspect 11, wherein the LDO voltage regulator includes: a PMOS FET coupled between a third voltage rail and the first voltage rail; and an operational amplifier including a first input to receive a programmable voltage, a second input coupled to the first voltage rail, and an output coupled to a gate of the PMOS FET.

Aspect 13: The apparatus of any one of aspects 2-12, further including a voltage controlled oscillator (VCO) including an output to produce the first clock.

Aspect 14: The apparatus of aspect 13, wherein the ring of N cascaded inverter stages and the control circuit are part of a frequency prescaler in a feedback loop of a phase locked loop (PLL) including the VCO.

Aspect 15: An apparatus, including a ring of N cascaded inverter stages, wherein N is a positive integer, wherein each stage of the ring of N cascaded inverter stages includes a first p-channel metal oxide semiconductor field effect transistor (PMOS FET), a second PMOS FET, and an NMOS FET coupled in series between first and second voltage rails, wherein the second PMOS FET of the $i^{th}$ cascaded inverter stage includes a gate coupled to a drain of the second PMOS FET of the $i^{th}-1$ (mod N) cascaded inverter stage for integer i from zero (0) to N-1, wherein the first PMOS FET of the $i^{th}$ cascaded inverter stage includes a gate coupled to the drain of the second PMOS FET of the $i^{th}-2$ (mod N) cascaded inverter stage for i from zero (0) to N-1, wherein each of the NMOS FET includes a gate to receive a first clock, and wherein the drain of one of the N cascaded inverter stages is coupled to output a second clock.

Aspect 16: The apparatus of aspect 15, further including a buffer including an input to receive the first clock and an output coupled to the gate of each of the NMOS FETs of the ring of N cascaded inverter stages.

Aspect 17: The apparatus of aspect 15 or 16, further including a buffer including an input coupled to the drain of the one of the N cascaded inverter stages to output the second clock.

Aspect 18: The apparatus of any one of aspects 15-17, wherein a divider ratio of a frequency of the first clock to a frequency of the second clock is an integer of N or less.

Aspect 19: The apparatus of any one of aspects 15-18, further including a voltage controlled oscillator (VCO) including an output to produce the first clock.

Aspect 20: The apparatus of aspect 19, wherein the ring of N cascaded inverter stages is part of a frequency prescaler in a feedback loop of a phase locked loop (PLL) including the VCO.

Aspect 21: A method, including: receiving a first clock; enabling each stage of a ring of N cascaded inverter stages substantially one at a time in response to the first clock in a first mode, wherein N is a positive integer; and outputting a second clock from an output of one of the ring of N cascaded inverter stages.

Aspect 22: The method of aspect 21, wherein enabling each of a ring of N cascaded inverter stages substantially one at a time includes turning on field effect transistors (FETs) in the N cascaded inverter stages in response to a set of N pulses of the first clock, respectively.

Aspect 23: The method of aspect 22, wherein each of the respectively turned on FETs in the N cascaded inverter stages includes an n-channel metal oxide semiconductor field effect transistor (NMOS FET).

Aspect 24: The method of aspect 22, wherein each of the respectively turned on FETs in the N cascaded inverter stages includes a p-channel metal oxide semiconductor field effect transistor (PMOS FET).

Aspect 25: The method of any one of aspects 21-24, further including enabling two or more of the N cascaded inverter stages in response to a same phase of the first clock in a second mode.

Aspect 26: The method of aspect 25, wherein a divider ratio of a frequency of the first clock to a frequency of the second clock is greater in the first mode than the divider ratio in the second mode.

Aspect 27: The method of any one of aspects 21-26, further including changing a supply voltage to the ring of N cascaded inverter stages to change a maximum or minimum operating frequency of the first clock.

Aspect 28: The method of any one of aspects 21-27, further including operating a voltage controlled oscillator (VCO) to generate the first clock.

Aspect 29: A wireless communication device, including: a phase locked loop (PLL) including a frequency prescaler, including: a ring of N cascaded inverter stages, wherein N is a positive integer, and a circuit to enable each stage of the ring of N cascaded inverter stages substantially one at a time based on a first clock, wherein an output of one of the N cascaded inverter stages produces a second clock; a local oscillator (LO) configured to generate an LO signal based on the second clock; and an up-converter or down-converter configured to up-convert or down-convert frequency of a first signal to generate a second signal based on the LO signal, respectively.

Aspect 30: The wireless communication device of aspect 29, wherein each of the N cascaded inverter stages includes a PMOS FET coupled in series with an NMOS FET between first and second voltage rails.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
    a ring of N cascaded inverter stages, wherein N is a positive integer, wherein each stage of the ring of N cascaded inverter stages comprises a p-channel metal oxide semiconductor field effect transistor (PMOS FET) coupled in series with an n-channel metal oxide semiconductor field effect transistor (NMOS FET) between first and second voltage rails, each of the NMOS FETs comprising a gate, wherein the PMOS FET of the $i^{th}$ cascaded inverter stage includes a gate coupled to a drain of the PMOS FET of the $i^{th}-1$ (mod N) cascaded inverter stage for integer i from zero (0) to N-1; and
    a control circuit including a set of N independent outputs coupled to the ring of N cascaded inverter stages, respectively, wherein the set of N independent outputs of the control circuit are coupled to the gates of the NMOS FETs of the ring of N cascaded inverter stages, respectively, and wherein the control circuit is configured to generate a set of N control signals at the set of N independent outputs, respectively, to enable each of the N cascaded inverter stages substantially one at a time in response to a first clock, wherein a second clock is generated at an output of one of the N cascaded inverter stages, and wherein a divider ratio of a frequency of the first clock to a frequency of the second clock is an integer of N or less.

2. The apparatus of claim 1, wherein the control circuit comprises:
a set of N NOR gates with outputs serving as the set of N independent outputs of the control circuit, respectively, wherein each of the set of N NOR gates includes a first input to receive the first clock, and wherein the $i^{th}$ NOR gate includes a second input coupled to the drain of the PMOS FET of the $i^{th}$-E (mod N) cascaded inverter stage for i from zero (0) to N−1, wherein E is an even positive integer less than N; or
a set of N AND gates with outputs serving as the set of N independent outputs of the control circuit, respectively, wherein each of the set of N AND gates includes a first input to receive the first clock, and wherein the $i^{th}$ AND gate includes a second input coupled to the drain of the PMOS FET of the $i^{th}$-R (mod N) cascaded inverter stage for i from zero (0) to N−1, wherein R is an odd positive integer less than N.

3. The apparatus of claim 1, wherein a subset of one or more of the N cascaded inverter stages each includes a switching device to selectively couple the gate of the NMOS FET of the $j^{th}$ cascaded inverter stage of the subset to either the $j^{th}$ output of the control circuit or the drain of the PMOS FET of the $j^{th}$−1 cascaded inverter stage for integer j from zero (0) to a number of one or more cascaded inverter stages in the subset, wherein the switching device selectively couples based on a divider ratio mode signal.

4. The apparatus of claim 3, wherein a divider ratio of a frequency of the first clock to a frequency of the second clock is greater when the gate of the NMOS FET of the $j^{th}$ cascaded inverter stage is coupled to the $j^{th}$ output of the control circuit than when the gate of the NMOS FET of the $j^{th}$ cascaded inverter stage is coupled to the drain of the PMOS FET of the $j^{th}$−1 cascaded inverter stage.

5. The apparatus of claim 3, wherein the switching device comprises:
a second PMOS FET coupled between the drain of the PMOS FET of the $j^{th}$−1 cascaded inverter stage and the gate of the NMOS FET of the $j^{th}$ cascaded inverter stage; and
a second NMOS FET coupled between the gate of the NMOS FET of the $j^{th}$ cascaded inverter stage and the $j^{th}$ output of the control circuit, wherein gates of the second PMOS FET and the second NMOS FET are coupled together to receive the divider ratio mode signal.

6. The apparatus of claim 1, wherein one or more of every other N-cascaded inverter stage includes a second NMOS FET coupled between the drain of the corresponding PMOS FET and the second voltage rail, wherein the second NMOS FET includes a gate to receive a pre-discharging signal.

7. The apparatus of claim 6, wherein one or more of every other N cascaded inverter stage not including the second NMOS FET includes a dummy NMOS FET coupled between the corresponding PMOS FET and the second voltage rail, wherein the dummy NMOS includes a gate coupled to the second voltage rail.

8. An apparatus, comprising:
a ring of N cascaded inverter stages, wherein N is a positive integer, wherein the N cascaded inverter stages are coupled between a first voltage rail and a second voltage rail; a voltage regulator to selectively change a difference in a supply voltage between the first and second voltage rails; and
a control circuit including a set of N independent outputs coupled to the ring of N cascaded inverter stages, respectively.

9. The apparatus of claim 8, wherein the voltage regulator comprises a low-dropout (LDO) voltage regulator.

10. The apparatus of claim 9, wherein the LDO voltage regulator comprises:
a PMOS FET coupled between a third voltage rail and the first voltage rail; and
an operational amplifier including a first input to receive a programmable voltage, a second input coupled to the first voltage rail, and an output coupled to a gate of the PMOS FET.

11. The apparatus of claim 1, further comprising a voltage controlled oscillator (VCO) including an output to produce the first clock.

12. The apparatus of claim 11, wherein the ring of N cascaded inverter stages and the control circuit are part of a frequency prescaler in a feedback loop of a phase locked loop (PLL) including the VCO.

13. An apparatus, comprising:
a ring of N cascaded inverter stages, wherein N is a positive integer, wherein each stage of the ring of N cascaded inverter stages comprises a first p-channel metal oxide semiconductor field effect transistor (PMOS FET), a second PMOS FET, and an NMOS FET coupled in series between first and second voltage rails, wherein the second PMOS FET of the $i^{th}$ cascaded inverter stage includes a gate coupled to a drain of the second PMOS FET of the $i^{th}$−1 (mod N) cascaded inverter stage for integer i from zero (0) to N−1, wherein the first PMOS FET of the $i^{th}$ cascaded inverter stage includes a gate coupled to the drain of the second PMOS FET of the $i^{th}$−2 (mod N) cascaded inverter stage for i from zero (0) to N−1, wherein each of the NMOS FET includes a gate to receive a first clock, and wherein the drain of one of the N cascaded inverter stages is coupled to output a second clock.

14. The apparatus of claim 13, further comprising a buffer including an input to receive the first clock and an output coupled to the gate of each of the NMOS FETs of the ring of N cascaded inverter stages.

15. The apparatus of claim 13, further comprising a buffer including an input coupled to the drain of the one of the N cascaded inverter stages to output the second clock.

16. The apparatus of claim 13, wherein a divider ratio of a frequency of the first clock to a frequency of the second clock is an integer of N or less.

17. The apparatus of claim 13, further comprising a voltage controlled oscillator (VCO) including an output to produce the first clock.

18. The apparatus of claim 17, wherein the ring of N cascaded inverter stages is part of a frequency prescaler in a feedback loop of a phase locked loop (PLL) including the VCO.

19. A method, comprising:
receiving a first clock;
enabling each stage of a ring of N cascaded inverter stages substantially one at a time in response to the first clock in a first mode, wherein N is a positive integer;
outputting a second clock from an output of one of the ring of N cascaded inverter stages; and changing a supply voltage to the ring of N cascaded inverter stages to change a maximum or minimum operating frequency of the first clock.

20. The method of claim 19, wherein enabling each of a ring of N cascaded inverter stages substantially one at a time comprises turning on field effect transistors (FETs) in the N cascaded inverter stages in response to a set of N pulses of the first clock, respectively.

21. The method of claim 20, wherein each of the respectively turned on FETs in the N cascaded inverter stages comprises an n-channel metal oxide semiconductor field effect transistor (NMOS FET).

22. The method of claim 20, wherein each of the respectively turned on FETs in the N cascaded inverter stages comprises a p-channel metal oxide semiconductor field effect transistor (PMOS FET).

23. The method of claim 19, further comprising enabling two or more of the N cascaded inverter stages in response to a same phase of the first clock in a second mode.

24. The method of claim 23, wherein a divider ratio of a frequency of the first clock to a frequency of the second clock is greater in the first mode than the divider ratio in the second mode.

25. The method of claim 19, further comprising operating a voltage controlled oscillator (VCO) to generate the first clock.

26. A wireless communication device, comprising:
a phase locked loop (PLL) including a frequency prescaler, comprising:
a ring of N cascaded inverter stages, wherein N is a positive integer; and
a circuit to enable each stage of the ring of N cascaded inverter stages substantially one at a time based on a first clock, wherein an output of one of the N cascaded inverter stages produces a second clock;
a local oscillator (LO) configured to generate an LO signal based on the second clock; and
an up-converter or down-converter configured to up-convert or down-convert frequency of a first signal to generate a second signal based on the LO signal, respectively.

27. The wireless communication device of claim 26, wherein each of the N cascaded inverter stages comprises a PMOS FET coupled in series with an NMOS FET between first and second voltage rails.

28. An apparatus, comprising:
a ring of N cascaded inverter stages, wherein N is a positive integer; and
a control circuit including a set of N independent outputs coupled to the ring of N cascaded inverter stages, respectively, wherein the control circuit is configured to generate a set of N control signals at the set of N independent outputs, respectively, to enable each of the N cascaded inverter stages substantially one at a time in response to a first clock, wherein a second clock is generated at an output of one of the N cascaded inverter stages, wherein a divider ratio of a frequency of the first clock to a frequency of the second clock is an integer of N or less, and wherein the ring of N cascaded inverter stages and the control circuit are part of a frequency prescaler in a feedback loop of a phase locked loop (PLL).

* * * * *